(12) United States Patent
Sun et al.

(10) Patent No.: US 12,426,423 B2
(45) Date of Patent: Sep. 23, 2025

(54) LIGHT-EMITTING SUBSTRATE, BACKLIGHT MODULE AND DISPLAY APPARATUS

(71) Applicants: Hefei BOE Ruisheng Technology Co., Ltd., Anhui (CN); BOE TECHNOLOGY GROUP CO., LTD., Beijing (CN)

(72) Inventors: Yiding Sun, Beijing (CN); Bing Zhang, Beijing (CN); Hai Tang, Beijing (CN); Liang Gao, Beijing (CN); Xiaolin Geng, Beijing (CN); Jianwei Qin, Beijing (CN); Xiao Wang, Beijing (CN)

(73) Assignees: Hefei BOE Ruisheng Technology Co., Ltd., Anhui (CN); BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 18/264,597

(22) PCT Filed: May 9, 2022

(86) PCT No.: PCT/CN2022/091755
§ 371 (c)(1),
(2) Date: Aug. 8, 2023

(87) PCT Pub. No.: WO2023/216070
PCT Pub. Date: Nov. 16, 2023

(65) Prior Publication Data
US 2025/0031502 A1    Jan. 23, 2025

(51) Int. Cl.
*H10H 20/857*   (2025.01)
*G02F 1/1335*   (2006.01)
(Continued)

(52) U.S. Cl.
CPC ...... *H10H 20/857* (2025.01); *G02F 1/133603* (2013.01); *G02F 1/133612* (2021.01); *H01L 25/167* (2013.01); *H10H 20/855* (2025.01)

(58) Field of Classification Search
CPC ............... H10H 20/857; H10H 20/855; G02F 1/133612; G02F 1/133603; H01L 25/167
See application file for complete search history.

(56) References Cited

U.S. PATENT DOCUMENTS

2016/0380162 A1  12/2016  Lin et al.
2018/0110125 A1   4/2018  Abe et al.
(Continued)

FOREIGN PATENT DOCUMENTS

CN   108831319 A   11/2018
CN   208062046 U   11/2018
(Continued)

OTHER PUBLICATIONS

PCT International Search Report (w/ English translation) and Written Opinion for corresponding PCT Application No. PCT/CN2022/091755, mailed Jan. 28, 2023, 10 pages.

*Primary Examiner* — Mary Ellen Bowman
(74) *Attorney, Agent, or Firm* — Dority & Manning, P.A.

(57) ABSTRACT

A light-emitting substrate includes a back plate, light-emitting regions arranged in an array and a bonding electrode group. The light-emitting regions are disposed on the back plate, and each light-emitting region is provided with at least one light-emitting group therein. The bonding electrode group is disposed on the back plate and includes a first bonding electrode and remaining bonding electrodes. A second power supply voltage terminal of a light-emitting group is electrically connected to a feedback signal line included in the light-emitting substrate, and the first bonding electrode is electrically connected to the feedback signal line. An impedance between the first bonding electrode and
(Continued)

an adjacent one of the remaining bonding electrodes is larger then an impedance between two adjacent and consecutive ones of the remaining bonding electrodes.

20 Claims, 16 Drawing Sheets

(51) Int. Cl.
  *G02F 1/13357* (2006.01)
  *H01L 25/16* (2023.01)
  *H10H 20/855* (2025.01)

(56) References Cited

U.S. PATENT DOCUMENTS

| | | | |
|---|---|---|---|
| 2020/0227605 A1* | 7/2020 | Fan | ............... H10H 29/142 |
| 2020/0295228 A1 | 9/2020 | Jang et al. | |
| 2021/0068219 A1 | 3/2021 | Lee et al. | |
| 2021/0358896 A1 | 11/2021 | Lee et al. | |
| 2022/0359574 A1 | 11/2022 | Lee et al. | |

FOREIGN PATENT DOCUMENTS

| | | |
|---|---|---|
| CN | 110429097 A | 11/2019 |
| CN | 111624813 A | 9/2020 |
| CN | 111668362 A | 9/2020 |
| CN | 112490229 A | 3/2021 |
| CN | 112908196 A | 6/2021 |
| CN | 113514975 A | 10/2021 |
| CN | 214409944 U | 10/2021 |
| CN | 113629065 A | 11/2021 |
| CN | 113707700 A | 11/2021 |
| CN | 113721396 A | 11/2021 |
| CN | 113870770 A | 12/2021 |
| CN | 114023277 A | 2/2022 |
| CN | 114361188 A | 4/2022 |
| JP | 2011023558 A | 2/2011 |

* cited by examiner

LIGHT-EMITTING SUBSTRATE, BACKLIGHT MODULE AND DISPLAY APPARATUS

CROSS-REFERENCE TO RELATED APPLICATION

The present application is a national phase entry under 35 USC 371 of International Patent Application No. PCT/CN2022/091755, filed on May 9, 2022, which is incorporated herein by reference in its entirety.

TECHNICAL FIELD

The present disclosure relates to the field of display technologies, and in particular, to a light-emitting substrate, a backlight module and a display apparatus.

BACKGROUND

A mini light-emitting diode (mini LED) display apparatus is a display apparatus adopting a sub-millimeter light-emitting diode as a light-emitting element. The sub-millimeter light emitting diode has a size greater than or equal to 80 μm and less than 500 μm as compared to conventional light emitting diodes.

The mini LED display apparatus can realize high contrast, a gradation of picture and the picture effect being close to reality, and the future market prospect is broad.

SUMMARY

In an aspect, a display substrate is provided. The light-emitting substrate includes a back plate, a plurality of light-emitting regions arranged in an array, a bonding electrode group and a feedback signal line. The plurality of light-emitting regions arranged in an array are disposed on the back plate; each light-emitting region is provided with at least one light-emitting group therein, a light-emitting group of the at least one light-emitting group is a first light-emitting group, and a second power supply voltage terminal of the first light-emitting group is electrically connected to the feedback signal line. The bonding electrode group is disposed on the back plate, the bonding electrode group includes a plurality of bonding electrodes disposed in parallel, and the plurality of bonding electrodes includes a first bonding electrode and remaining bonding electrodes. The feedback signal line is electrically connected to the first bonding electrode, and the feedback signal line is configured to transmit a feedback signal. An impedance between the first bonding electrode and an adjacent one of the remaining bonding electrodes is larger than an impedance between two adjacent and consecutive ones of the remaining bonding electrodes.

In some embodiments, the impedance between the first bonding electrode and the adjacent one of the remaining bonding electrodes is greater than 10G ohms.

In some embodiments, in an extending direction of the bonding electrode group, a ratio of a distance between the first bonding electrode and the adjacent one of the remaining bonding electrode to a distance between the two adjacent and consecutive ones of the remaining bonding electrodes is greater than or equal to 3.

In some embodiments, the distance between the first bonding electrode and the adjacent one of the remaining bonding electrodes is greater than 600 μm.

In some embodiments, at least one first empty space and/or at least one redundant bonding electrode is provided between the first bonding electrode and the adjacent one of the remaining bonding electrodes. A first empty space is a region, where a bonding electrode is to be provided and no bonding electrode is actually provided, reserved in the bonding electrode group; the redundant bonding electrode transmits no signal.

In some embodiments, in a case where at least one first empty space is provided between the first bonding electrode and the adjacent one of the remaining bonding electrodes, a width of a first empty space is greater than the distance between the two adjacent and consecutive ones of the remaining bonding electrodes.

In some embodiments, in a case where at least one redundant bonding electrode is provided between the first bonding electrode and the adjacent one of the remaining bonding electrodes, a width of a redundant bonding electrode is greater than the distance between the two adjacent and consecutive ones of the remaining bonding electrodes.

In some embodiments, in a case where at least one first empty space is provided between the first bonding electrode and the adjacent one of the remaining bonding electrodes, a distance between the first bonding electrode and an immediately adjacent first empty space is equal to the distance of the two adjacent and consecutive ones of the remaining bonding electrodes.

In some embodiments, in a case where at least one redundant bonding electrode is provided between the first bonding electrode and the adjacent one of the remaining bonding electrodes, a distance between the first bonding electrode and an immediately adjacent redundant bonding electrode is equal to the distance of the two adjacent and consecutive ones of the remaining bonding electrodes.

In some embodiments, the light-emitting substrate further includes a first power supply voltage signal line. A first power voltage terminal of the first light emitting group is electrically connected to the first power voltage signal line; the remaining bonding electrodes include a power supply voltage bonding electrode, and the power supply voltage bonding electrode is electrically connected to the first power supply voltage signal line. At least one first empty space and/or at least one redundant bonding electrode is provided between the power supply voltage bonding electrode and an adjacent one of the remaining bonding electrode.

In some embodiments, the light-emitting substrate further includes a second power supply voltage signal line and a third power supply voltage signal line. The light-emitting region is further provided at least one chip therein, and each light-emitting group is electrically connected to a single chip; an output pin of a chip is electrically connected to the second power supply voltage terminal of the first light-emitting group, a first power supply pin of the chip is electrically connected to the second power supply voltage signal line, and a second power supply pin of the chip is electrically connected to the third power supply voltage signal line. A plurality of chips located in a same light-emitting region are sequentially cascaded; and an output pin of a last chip in the plurality of cascaded chips is electrically connected to the feedback signal line.

In some embodiments, the remaining bonding electrodes include a second bonding electrode disposed on a side adjacent to the first bonding electrode, the second power voltage signal line is electrically connected to the second bonding electrode, and the second bonding electrode is configured to transmit a second level signal to the chip. At least one redundant bonding electrode, or at least one first empty space, or both at least one redundant bonding electrode and at least one first empty space are provided between the second bonding electrode and the first bonding electrode.

In some embodiments, the remaining bonding electrodes include a third bonding electrode disposed on another side adjacent to the first bonding electrode, the third power voltage signal line is electrically connected to the third bonding electrode, and the third bonding electrode is configured to transmit a first level signal to the chip. At least one redundant bonding electrode, or at least one first empty space, or both at least one redundant bonding electrode and at least one first empty space are provided between the third bonding electrode and the first bonding electrode.

In some embodiments, the light-emitting substrate further includes a flexible circuit board or a chip on flex, and the flexible circuit board or the chip on flex includes a gold finger, and the bonding electrode group is electrically connected to the gold finger. A thickness of the gold finger is in a range of 6 µm to 10 µm.

In some embodiments, the gold finger includes a plurality of conductive contacts, the plurality of conductive contacts include at least a first conductive contact and remaining conductive contacts, and each of the plurality of conductive contacts is electrically connected to a bonding electrode. The first conductive contact is configured to be electrically connected to the first bonding electrode, and a second empty space and/or a redundant contact is provided between the first conductive contact and an adjacent one of the remaining conductive contacts. At least one first empty space and/or at least one redundant bonding electrode is provided between the first bonding electrode and the adjacent one of the remaining bonding electrodes. An orthographic projection of the second empty space on the back plate at least partially overlaps with an orthographic projection of a first empty space on the back plate, and an orthographic projection of a redundant bonding electrode on the back plate at least partially overlaps with an orthographic projection of the redundant contact on the back plate.

In some embodiments, an anisotropic conductive film is provided between the bonding electrode group and the gold finger. A thickness of the anisotropic conductive film is in a range of 9 µm to 13 µm.

In another aspect, a backlight module is provided. The backlight module includes the light-emitting substrate according to any one of the embodiments of the above aspect and a driver chip. The light-emitting substrate further includes a flexible circuit board or a chip on flex, the flexible circuit board or the chip on flex includes a gold finger including a first conductive contact, and the bonding electrode group is electrically connected to the gold finger; the light-emitting region is further provided at least one chip therein. The driver chip is disposed on a backlight side of the light-emitting substrate, the driver chip is electrically connected to the first conductive contact, and the driver chip is configured to receive a feedback signal output by a chip.

In some embodiments, the backlight module further includes a plurality of supporters, a diffuser plate, a quantum dot film, a diffuser sheet, and a composite film. The plurality of support columns are fixed on a light exit side of the light-emitting substrate; the diffusion plate is disposed on an end of the plurality of supporters away from the light-emitting substrate; the quantum dot film is disposed on a side of the diffusion plate away from the light-emitting substrate; the diffusion sheet is disposed on a side of the quantum dot film away from the light-emitting substrate; the composite film is disposed on a side of the diffusion sheet away from the light-emitting substrate.

In yet another aspect, a display apparatus is provided. The display apparatus includes the backlight module according to any one of the embodiments of the above aspect and a display panel stacked on a light exit side of the backlight module.

BRIEF DESCRIPTION OF THE DRAWINGS

In order to describe technical solutions in the present disclosure more clearly, the accompanying drawings to be used in some embodiments of the present disclosure will be introduced briefly. Obviously, the accompanying drawings to be described below are merely accompanying drawings of some embodiments of the present disclosure, and a person of ordinary skill in the art can obtain other drawings according to those drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
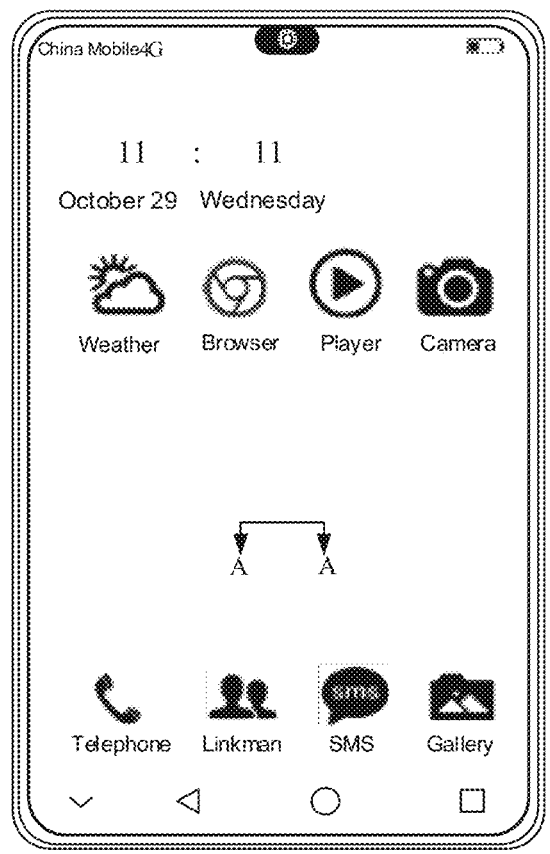
FIG. 1 is a structural diagram of a display apparatus provided in some embodiments of the present disclosure.

Technical solutions in some embodiments of the present disclosure will be described clearly and completely below with reference to the accompanying drawings. All other embodiments obtained by a person having ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed in an open and inclusive sense, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics described herein may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of"/"the plurality of" means two or more unless otherwise specified.

Some embodiments may be described using the terms "coupled", "connected" and their derivatives. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is, optionally, construed to mean "when" or "upon" or "in response to determining" or "in response to detecting", depending on the context. Similarly, depending on the context, the phrase "if it is determined" or "if [a stated condition or event] is detected" is optionally construed as "in a case where it is determined that", "in response to determining that", "in a case where [the stated condition or event] is detected", or "in response to detecting [the stated condition or event]".

The phase "applicable to" or "configured to" as used herein indicates an open and inclusive expression, which does not exclude devices that are applicable to or configured to perform additional tasks or steps.

In addition, the phrase "based on" used is meant to be open and inclusive, since processes, steps, calculations or other actions "based on" one or more of the stated conditions or values may, in practice, be based on additional conditions or values exceeding those stated.

The term such as "about", "substantially" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system)

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of regions in a device, and are not intended to limit the scope of the exemplary embodiments.

Some embodiments of the present disclosure provide a display apparatus 1000, as shown in FIG. 1, the display apparatus 1000 may be any apparatus that displays images whether in motion (e.g., videos) or stationary (e.g., still images) and whether text or images. For example, the display apparatus 1000 may be any product or component having a display function, such as a television, a notebook computer, a tablet computer, a mobile phone, a personal digital assistant (PDA), a navigator, a wearable device, an augmented reality (AR) device or a virtual reality (VR) device.

Figure 2:
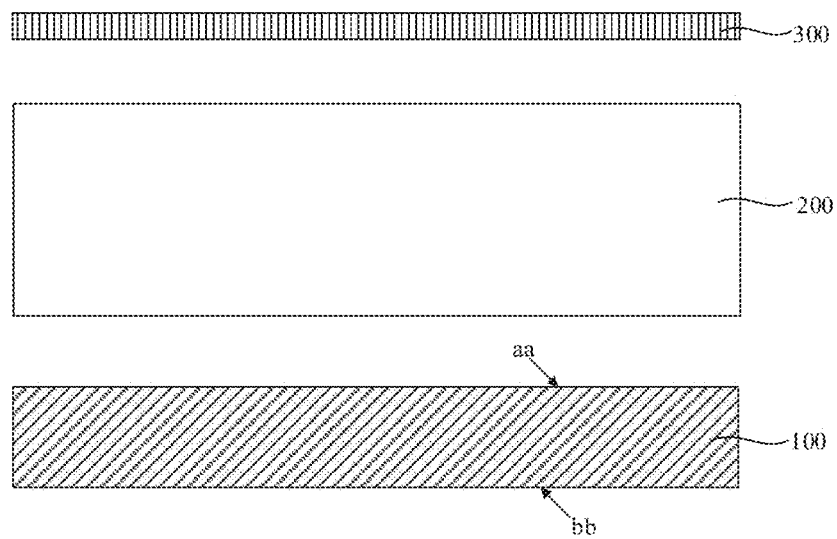
FIG. 2 is a sectional view taken along the line A-A' in FIG. 1.

In some embodiments, the display apparatus 1000 may be a liquid crystal display (LCD) apparatus, as shown in FIG. 2, the display apparatus 1000 may include a backlight module 100, a display panel 200 and a glass cover plate 300. The backlight module 100 includes a light exit side aa and a backlight side bb, the light exit side aa is a surface of the backlight module 100 emitting light, and the backlight side bb is another surface of the backlight module 100 opposite to the light exit side aa. The backlight module 100 may be used to provide a light source to the display panel 200, and the display panel 200 is disposed on the light exit side aa of the backlight module 100. The glass cover plate 300 is disposed on a side of the display panel 200 away from the backlight module 100, and the glass cover plate 300 is used for protecting the display panel 200.

Figure 3:
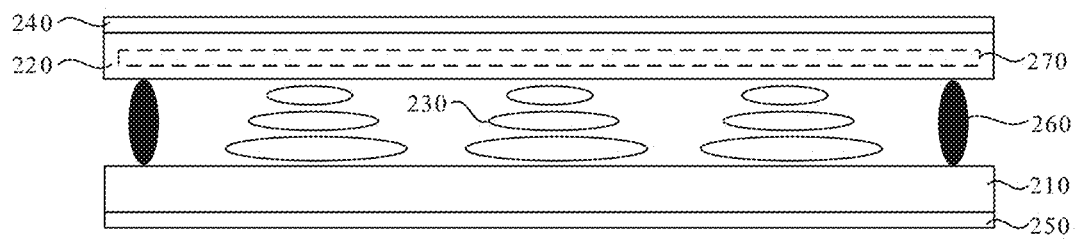
FIG. 3 is a structural diagram of a display panel provided in some embodiments of the present disclosure.

In some examples, as shown in FIG. 3, the display panel 200 includes an array substrate 210, an opposite substrate 220, a liquid crystal layer 230, an upper polarizing layer 240, a lower polarizing layer 250, and a sealant 260. The liquid crystal layer 230 is disposed between the array substrate 210 and the opposite substrate 220, and the array substrate 210 and the opposite substrate 220 are assembled together by the sealant 260, so that the liquid crystal layer 230 is limited in a liquid crystal cell enclosed by the array substrate 210, the opposite substrate 220 and the sealant 260.

In some examples, in order to enable the liquid crystal display apparatus to implement color display, as shown in FIG. 3, the display panel 200 may further include a color filter layer 270. The color filter layer 270 may be disposed in the opposite substrate 220, and in this case, the opposite substrate 220 may be referred to as a color filter substrate.

Figure 4:
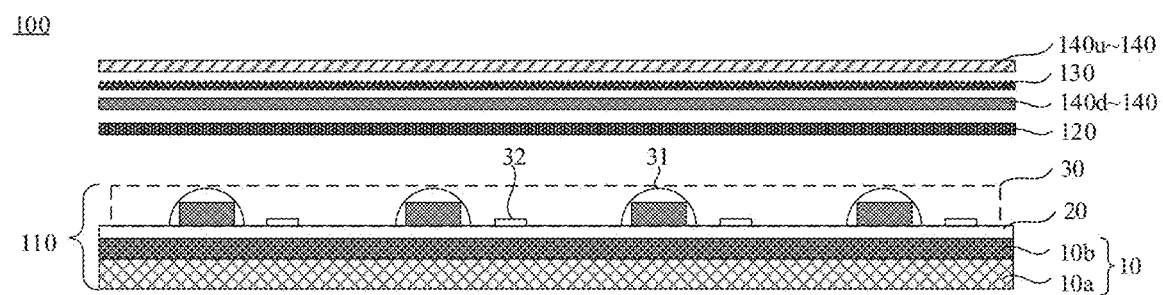
FIG. 4 is a structural diagram of a backlight module provided in some embodiments of the present disclosure.

In some embodiments, as shown in FIG. 4, the backlight module 100 includes a light-emitting substrate 110. The light-emitting substrate 110 includes a back plate 10, a reflective film 20, and a light-emitting device layer 30 sequentially disposed from bottom to top. The back plate 10 includes a substrate 10a and a driving circuit layer 10b disposed on the substrate 10a, the reflective film 20 is disposed on a side of the driving circuit layer 10b away from the substrate 10a, and the light-emitting device layer 30 is disposed on a side of the reflective film 20 away from the substrate 10a.

In some examples, the light-emitting device layer 30 includes light-emitting devices 31 and a chip 32, and the light-emitting devices 31 are arranged in an array. For example, the light-emitting devices 31 may be each a light-emitting diode (LED), that is, a size of the LED is greater than or equal to 500 µm, and a distance between the LEDs is greater than 2 mm. That is, the LEDs serve as point light sources of the backlight module 100.

In a case where the light-emitting device 31 is the LED, as shown in FIG. 4, the backlight module 100 further includes a diffuser 120, a brightness enhancement film (a prism sheet) 130 and a diffuser 140. The diffuser 120 is disposed on a light exit side of the light-emitting substrate 110, that is, the diffuser 120 is disposed on a side of the reflective film 20 away from the driving circuit. The diffuser 120 may be used to provide mechanical support for the brightness enhancement film (the prism sheet) 130 and the diffuser 140, and diffuse the point light sources into a surface light source. The diffusion sheet 140 includes an upper diffusion sheet 140u and a lower diffusion sheet 140d. The lower diffusion sheet 140d is located on a side of the diffusion plate 120 away from the light-emitting substrate 110, and the lower diffusion sheet 140d generates diffuse reflection after light of the surface light source passes through the diffusion layer arranged thereon, so that the light is uniformly distributed, and the brightness of the light exit side of the backlight module 100 is uniform. The upper diffusion sheet 140u is located on a side of the lower diffusion sheet 140d away from the light-emitting substrate 110, and the upper diffusion sheet 140u is used to protect the display panel 200 from being contaminated or scratched by external objects such as the backlight module 100. The brightness enhancement film (the prism sheet) 130 is disposed between the upper diffusion sheet 140u and the lower diffusion sheet 140d to further improve the brightness of the backlight module 100 in the display range on the light exit side.

In some other examples, the light-emitting device is a sub-millimeter light-emitting diode (mini LED) and/or a micro light-emitting diode (micro LED). A size of the mini LED is greater than or equal to 100 µm and less than 500 µm; a size of the micro LED is less than 100 µm.

Figure 5:
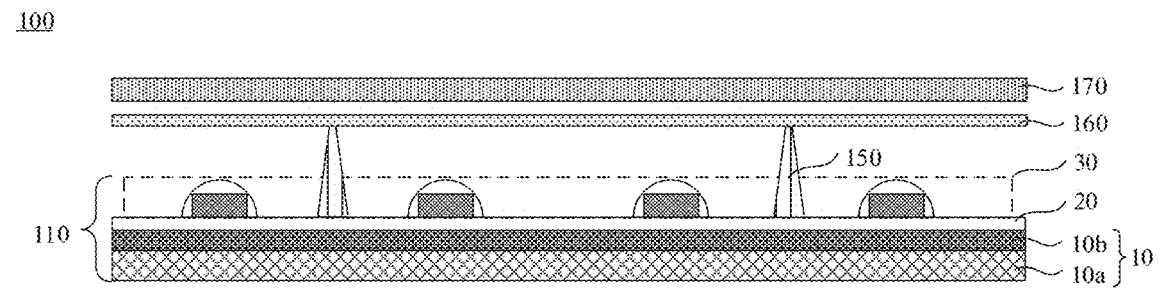
FIG. 5 is a structural diagram of another backlight module provided in some embodiments of the present disclosure.

In a case where the light-emitting device is mini LED and/or micro LED, as shown in FIG. 5, another backlight module 100 further includes supporters 150, a quantum dot film 160, and an optical film layer 170. The supporters 150 are fixed onto the reflective film 20 by an adhesive, and function thereof is to support each film to obtain a certain light mixing distance and eliminate the lamp shadow. The light-emitting substrate 110 may emit blue light, and the quantum dot film 160 may include a red quantum dot material, a green quantum dot material, and a transparent material. When passing through the red quantum dot material, the blue light emitted from the light-emitting substrate 110 is converted into red light; when passing through the green quantum dot material, the blue light is converted into green light; no color conversion occurs when the blue light passes through the transparent material. Then, the blue light, the red light, and the green light are mixed and superimposed at a predetermined ratio to produce white light.

The optical film layer 170 may include optical film(s) such as a diffuser plate and/or an optical brightness enhancement film. The diffuser plate has scattering and diffusing effects and is able to further mix the white light; the optical brightness enhancement film is able to improve the light extraction efficiency of the backlight module 100. The embodiment of the disclosure does not specifically limit the structure of the optical film layer 170.

Figure 6:
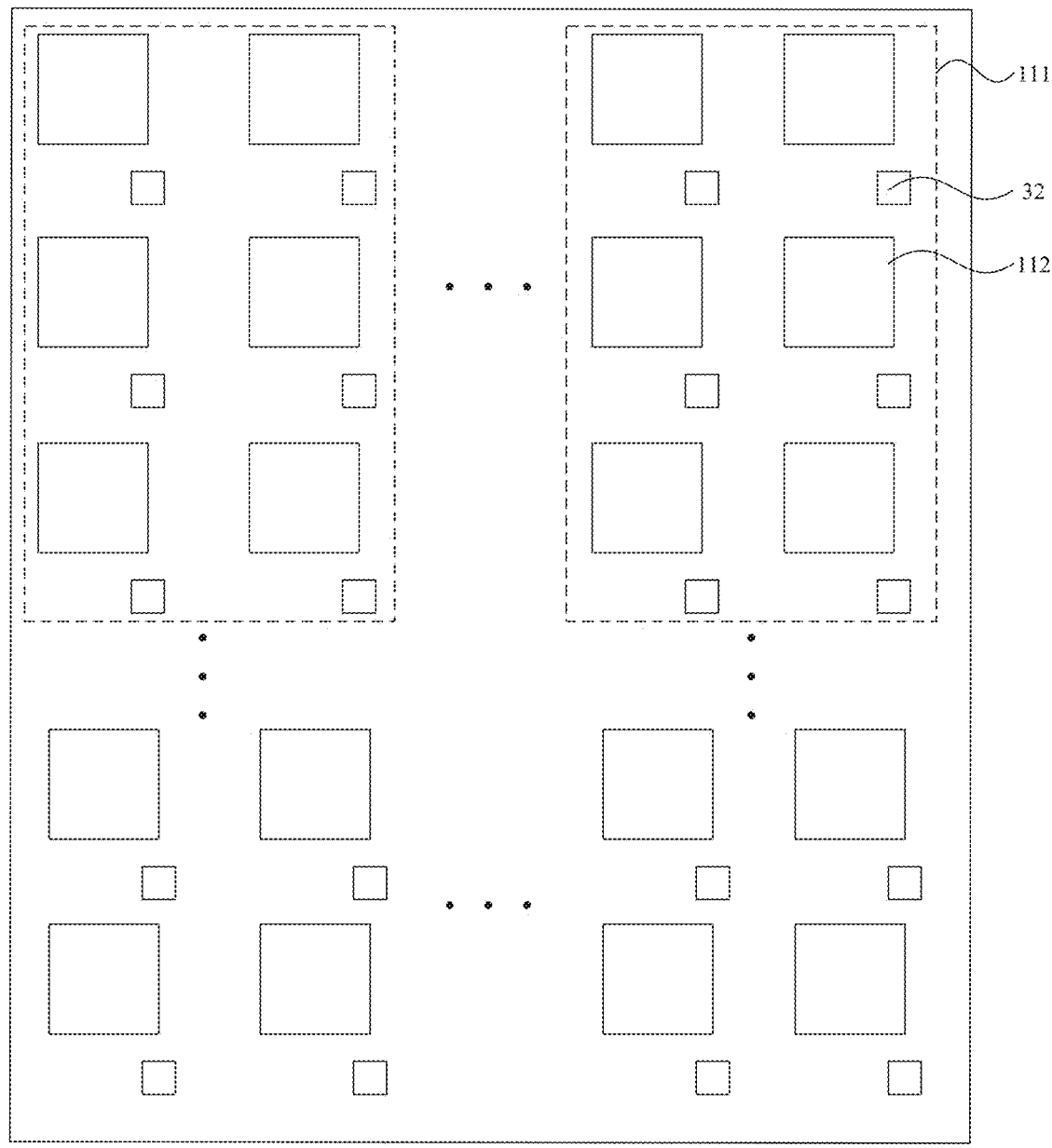
FIG. 6 is a structural diagram of a light-emitting substrate on a light exit side provided in some embodiments of the present disclosure.

In some embodiments, as shown in FIG. 6, the light-emitting substrate 110 includes a plurality of light-emitting regions 111 arranged in an array; each light-emitting region 111 is provided with at least one light-emitting group 112 and at least one chip 32 therein, each light-emitting group 112 is electrically connected to a chip 32, and a plurality of chips 32 located in a same light-emitting region 111 are cascaded.

In some examples, the light-emitting regions 111 are arranged in the light-emitting substrate 110 in an array, each light-emitting region 111 is provided with a plurality of light-emitting groups 112 and a plurality of chips 32 therein, and each light-emitting group 112 is electrically connected to a chip 32. In each light-emitting region, one of the at least one light-emitting group is a first light-emitting group, and a last chip of the plurality of cascaded chips 32 is electrically connected to the first light-emitting group. The light-emitting substrate 110 further includes a plurality of signal lines, the plurality of signal lines are disposed in the driving circuit layer and pass through the light-emitting region 111, and the light-emitting groups 112 and the chips 32 in the light-emitting region 111 are electrically connected to the corresponding signal lines. The plurality of chips 32 in the same light-emitting region 111 are connected in series to create a cascade relationship.

Figure 7:
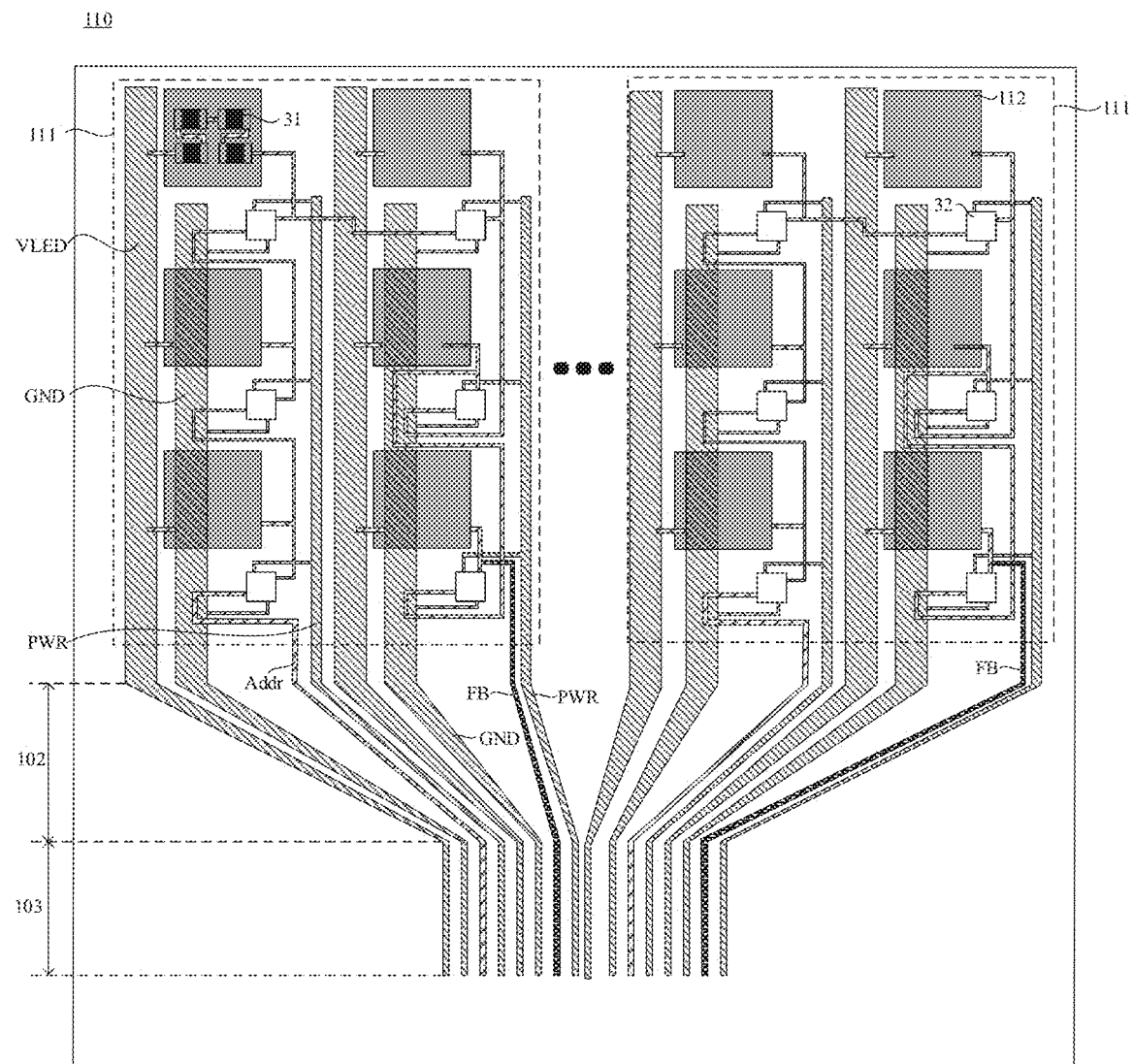
FIG. 7 is a diagram showing an inner structure of a light-emitting substrate provided in some embodiments of the present disclosure.

In some embodiments, as shown in FIG. 7, the light-emitting group 112 include a plurality of light-emitting devices 31, for example, the light-emitting device 31 may be the mini-LED and/or the micro LED, each light-emitting group 112 may include 4, 6, 8, or 9 light-emitting devices 31, and the plurality of light-emitting devices 31 may be connected in series and/or in parallel. For example, as shown in FIG. 8, FIG. 8 being an enlarged view of a partial position of FIG. 7, the light-emitting group 112 includes four light-emitting devices 31 connected in series; a first terminal of a first light-emitting device 31 of the four light-emitting devices 31 connected in series is a first power supply voltage terminal VLED' of the light-emitting group 112; a second terminal of a last light-emitting device 31 of the four light-emitting devices 31 connected in series is a second power supply voltage terminal Out' of the light-emitting group 112.

In some embodiments, as shown in FIG. 7, the plurality of signal lines includes first power supply voltage signal lines VLED, second power supply voltage signal lines PWR, third power supply voltage signal lines GND, address signal lines Addr, and feedback signal lines FB. As shown in FIG. 8, each chip 32 may have four pins, i.e., a signal input pin In, an output pin Out, a first power supply pin Vdd, and a second power supply pin Vss. The plurality of chips 32 in the same light-emitting region 111 are sequentially cascade connected. The plurality of chips 32 are sequentially cascade connected, and in two chips 32 cascade connected to each other, an output pin Out of a former chip 32 is electrically connected to a signal input pin In of a latter chip 32.

Figure 8:
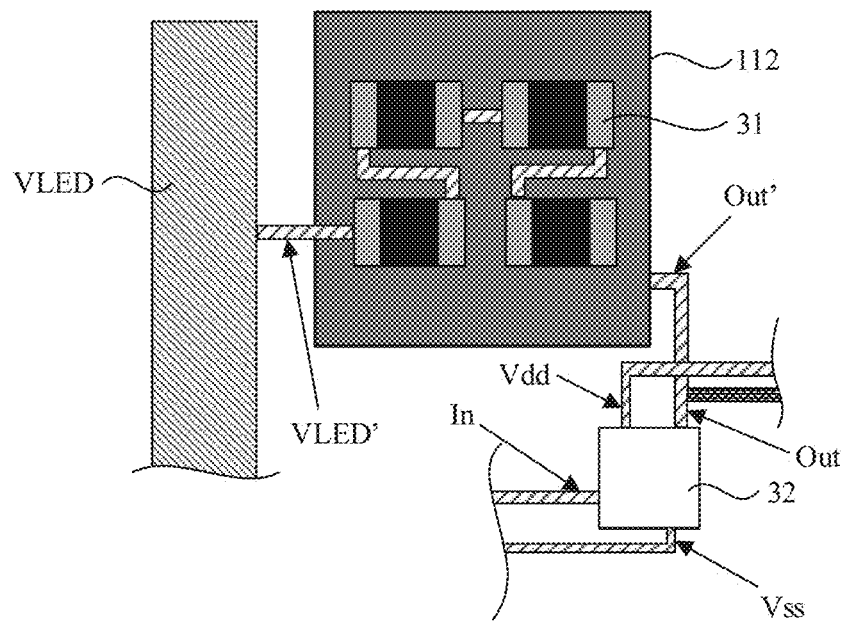
FIG. 8 is a connection structural diagram of a light-emitting group and a chip provided in some embodiments of the present disclosure.

As shown in FIGS. 7 and 8, the first power voltage terminal VLED' of the light-emitting group 112 is electrically connected to a first power voltage signal line VLED, and the first power voltage signal line VLED is configured to transmit a third level signal to the light-emitting group 112; for example, the third level signal may be a high level signal. The first power supply pin Vdd of each chip 32 is electrically connected to a second power voltage signal line PWR, and the second power voltage signal line PWR is configured to transmit a second level signal to the chip 32; for example, the second level signal may be a high level signal. The second power supply pin Vss of each chip 32 is electrically connected to a third power supply voltage signal line GND, and the third power supply voltage signal line GND is configured to transmit a first level signal to the chip 32; for example, the first level signal may be a low level signal.

The second power supply voltage terminal Out' of each light-emitting group 112 is electrically connected to the output pin Out of the corresponding chip 32. The chip 32 corresponding to the light-emitting group 112 means that the second power supply voltage terminal Out' of the light-emitting group 112 is electrically connected to the chip 32, and the light-emitting group 112 and the chip 32 that are connected to each other are close to each other. Meanwhile, the output pin Out of the chip 32 is electrically connected to a signal input pin In of another chip. Thus, the plurality of chips 32 of the same light-emitting region 111 are cascaded; an input pin In of a first chip 32 in the cascade plurality of chips 32 is electrically connected to an address signal line Addr, and the address signal line Addr is configured to transmit an address signal to the chip 32; an output pin Out of a last chip 32 in the plurality of cascaded chips 32 is electrically connected to a feedback signal line FB, the output pin Out of the chip 32 is configured to output a feedback signal, and the feedback signal line FB is configured to transmit the feedback signal.

In some embodiments, as shown in FIG. 7, the light-emitting substrate 110 further includes a fan-out region 102 and a bonding region 103 in addition to the light-emitting regions 111, the plurality of signal lines are led out from the light-emitting regions 111 to the bonding region 103 through the fan-out region 102, and the plurality of signal lines are electrically connected to a bonding electrode group in the bonding region 103. The bonding electrode group includes a plurality of bonding electrodes arranged in parallel, and each bonding electrode is electrically connected to a signal line.

Figure 9:
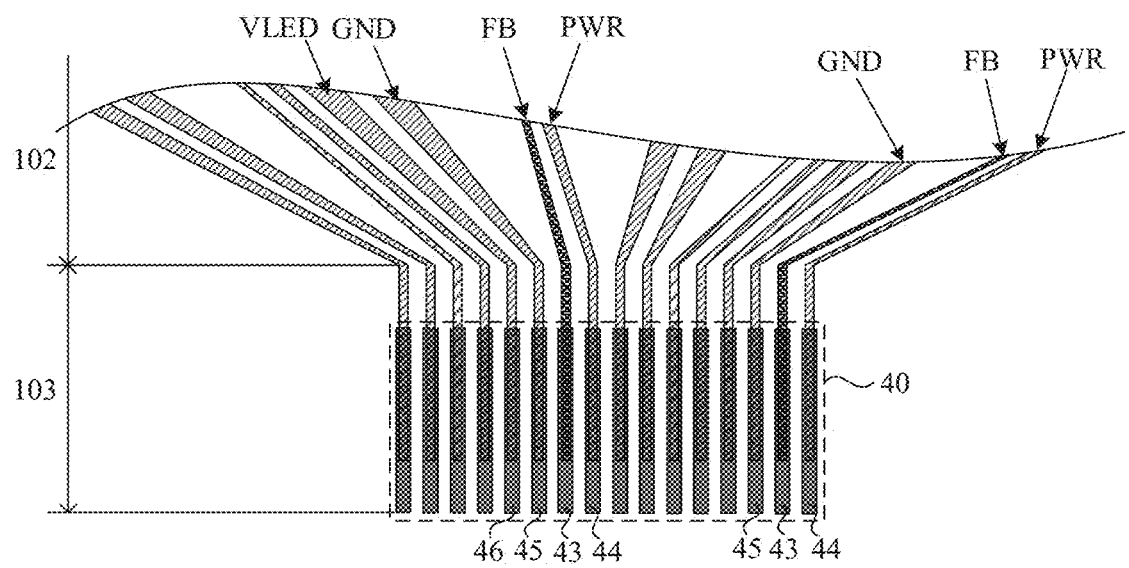
FIG. 9 is a connection structural diagram of a bonding electrode group and signal lines provided in some examples.

In some examples, as shown in FIG. 9, the bonding electrode group 40 is disposed on the back plate, and the bonding electrode group 40 includes a plurality of bonding electrodes disposed in parallel; for example, the plurality of bonding electrodes includes first bonding electrodes 43 and remaining bonding electrodes. The feedback signal line FB is electrically connected to a first bonding electrode 43. That is, the output pin of the last chip in the cascade plurality of chips 32 is electrically connected to the second power supply voltage terminal of the first light-emitting group and the first bonding electrode 43. The remaining bonding electrodes include a power supply voltage bonding electrode, a second bonding electrode, a third bonding electrode, and a fourth bonding electrode. The power supply voltage bonding electrode 46 is a bonding electrode connected to the first power supply voltage signal line VLED, the second bonding electrode is a bonding electrode connected to the second power supply voltage signal line PWR, the third bonding electrode is a bonding electrode connected to the third power supply voltage signal line GND, and the fourth bonding electrode is a bonding electrode connected to the address signal line Addr.

In the embodiments of the present disclosure, a "high level" indicates a magnitude of a potential of an electric signal received or output at a node, a terminal, or an output terminal in a circuit; for example, the potential of the high level signal may be 3.3 V or 5 V. The "low level" indicates a magnitude of a potential of an electric signal received or output at a node, a terminal, or an output terminal in a circuit; for example, the low level signal may refer to a ground signal; the potential of the low level signal may be 0 V.

As shown in FIG. 9, the remaining bonding electrodes include second bonding electrodes 44, and a second bonding electrode 44 is disposed on a side of and adjacent to the first bonding electrode 43. The second power supply voltage signal line PWR is electrically connected to the second bonding electrode 44, and the second bonding electrode 44 is configured to transmit a second level signal to the chip. That is, the second bonding electrode 44 is electrically connected to the first power supply pin of the chip, and the second bonding electrode 44 is configured to transmit a high-level signal to the chip.

The remaining bonding electrodes include third bonding electrodes 45, a third bonding electrode 45 is disposed on the other side of and adjacent to the first bonding electrode 43. The third power supply voltage signal line GND is electrically connected to the third bonding electrode 45, and the third bonding electrode 45 is configured to transmit a first level signal to the chip. That is, the third bonding electrode 45 is electrically connected to the second power supply pin of the chip, and the third bonding electrode 45 is configured to transmit a low-level signal to the chip.

Figure 10:
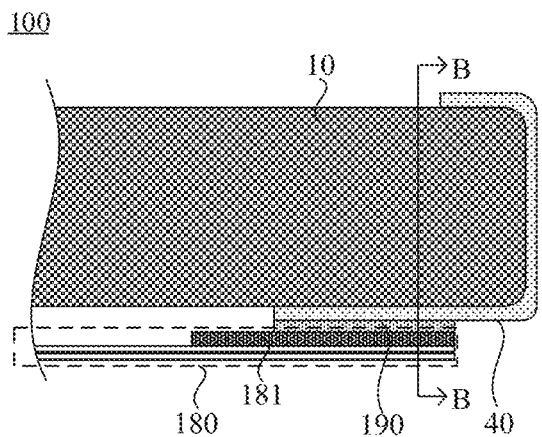
FIG. 10 is a side view of a bonding electrode group and signal lines provided in some embodiments of the disclosure.

In some embodiments, as shown in FIG. 10, the backlight module 100 further includes a flexible printed circuit (FPC) or a chip on flex (COF) 180, the FPC or the COF 180 includes a gold finger 181, and the gold finger 181 is attached to the bonding electrode group 40, that is, an orthographic projection of the gold finger 181 on the back plate 10 overlaps an orthographic projection of the bonding electrode group 40 on the back plate 10. An anisotropic conductive film (ACF) 190 is filled between the gold finger 181 and the bonding electrodes, and the gold finger 181 and the bonding electrodes are pressed together, so that the gold finger 181, the ACF 190 and the bonding electrode group 40 are electrically connected.

Figure 11:
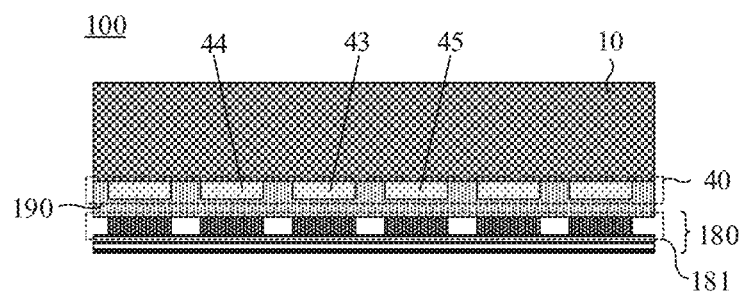
FIG. 11 is a sectional view taken along the line B-B' in FIG. 10.

In some examples, as shown in FIG. 11, when the light-emitting region is in an off state, the second power supply voltage terminal of the first light-emitting group is electrically connected to the first bonding electrode 43, the ACF 190 is filled between the first bonding electrode 43 and the second bonding electrode 44 and/or the third bonding electrode 45. There are conductive particles in the ACF 190, and an impedance between the first bonding electrode 43 and the second bonding electrode 44 and/or the third bonding electrode 45 is smaller than 10G ohms. That is, a closed circuit is formed between the first power supply voltage signal line, the first light-emitting group, the first bonding electrode 43, and the second bonding electrode 44, so that the first light-emitting group may have a weak luminance when the light-emitting region is in the off state.

There are a plurality of light-emitting regions in the display apparatus, when the screen of the display apparatus is in an off state, each light-emitting region may have a light-emitting group with weak luminance, and when a picture is displayed, the region with weak luminance has negative influence on the picture quality.

Figure 12:
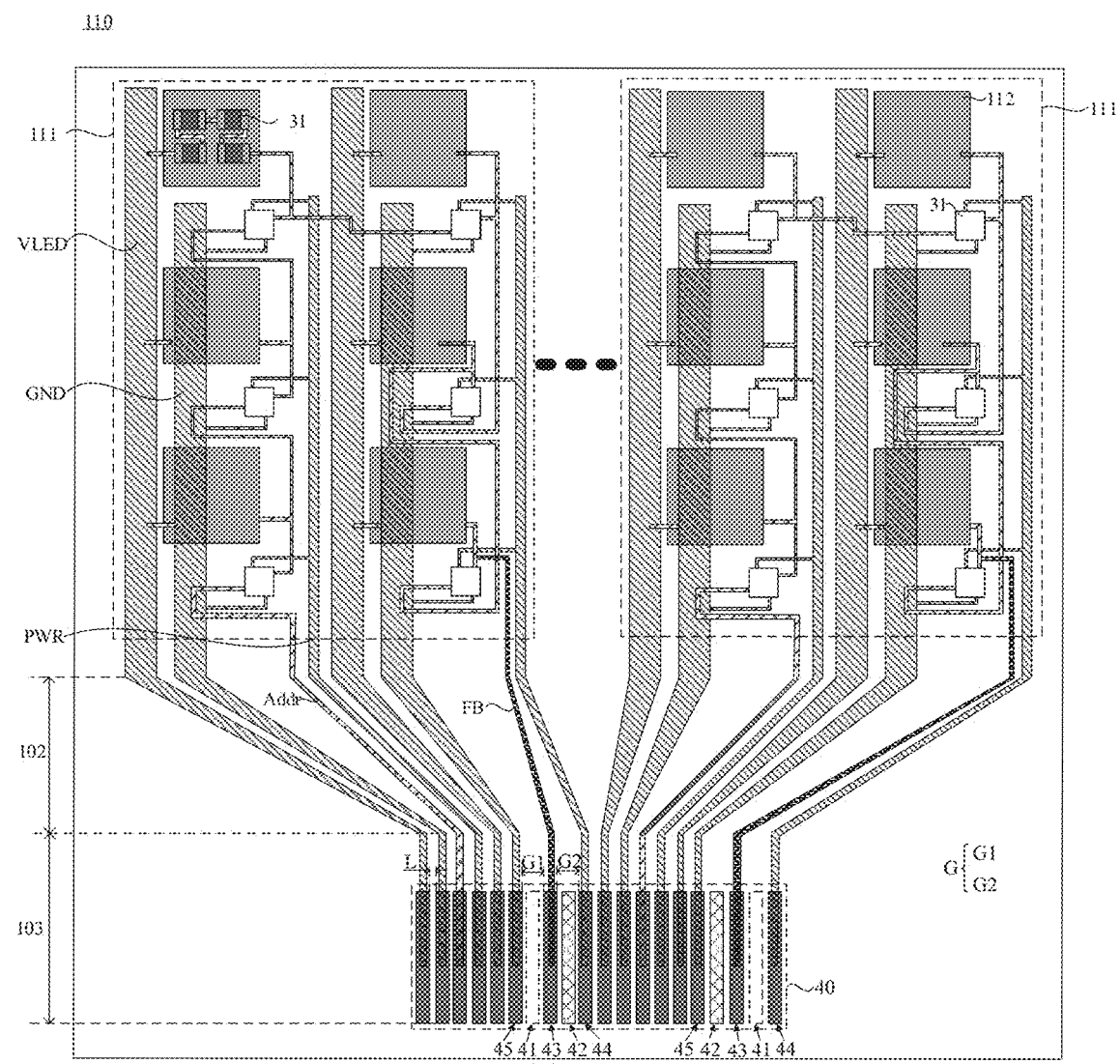
FIG. 12 is a diagram showing an inner structure of another light-emitting substrate provided in some embodiments of the present disclosure.

Based on this, some embodiments of the present disclosure provide a light-emitting substrate, as shown in FIG. 12, the light-emitting substrate 110 includes a back plate, a plurality of light-emitting regions 111, and a bonding electrode group 40. A structure of the back plate, an arrangement of the plurality of light-emitting regions 111, a structure and position of the bonding electrode group 40, and a connection relationship between the bonding electrode group 40 and the plurality of light-emitting regions 111 are described in detail in the above embodiments, and are not repeated here.

In some embodiments, the bonding electrode group 40 includes first bonding electrodes 43 and remaining bonding electrodes; an impedance between a first bonding electrode 43 and an adjacent one of the remaining bonding electrodes is greater than an impedance between two adjacent and consecutive ones of the remaining bonding electrodes.

It will be noted that the one of the remaining bonding electrodes adjacent to the first bonding electrode 43 refers to one of the remaining bonding electrodes closest to the first bonding electrode 43, such as the second bonding electrode 44 located on a side of the first bonding electrode 43, or a third bonding electrode 45 located on the other side of the first bonding electrode 43. The two adjacent and consecutive ones of the remaining bonding electrodes means that the two of the remaining bonding electrodes are adjacent and no other electrode or first empty space 41 is provided between the two of the remaining bonding electrodes.

In some examples, as shown in FIG. 9, in the plurality of bonding electrodes included in the bonding electrode group 40, an impedance between every two adjacent bonding electrodes is approximately equal; for example, the impedance is smaller than 10G ohms. In FIG. 9, the impedance between the first bonding electrode 43 and an adjacent one of the remaining bonding electrodes is approximately equal to the impedance between two adjacent ones of the remaining bonding electrodes. In this embodiment, i.e., in FIG. 12, the impedance between the first bonding electrode 43 and the adjacent one of the remaining bonding electrodes is greater than the impedance between the two adjacent and consecutive ones of the remaining bonding electrodes, which increases the impedance between the first bonding electrode 43 and the adjacent one of the remaining bonding electrodes as compared to the example in FIG. 9.

In some examples, the remaining bonding electrodes include a second bonding electrode 44 on a side of the first bonding electrode 43 and a third bonding electrode 45 on the other side of the first bonding electrode 43. In a case where the impedance between the first bonding electrode 43 and the second bonding electrode 44 and/or the third bonding electrode 45 is relatively large, there is no enough current pass through the closed circuit between the first power supply voltage signal line VLED, the first light-emitting group, the first bonding electrode 43 and the second bonding electrode 44. That is, the current passing through the first light-emitting group is smaller than a turn-on current, which cannot make the light-emitting group 112 generate the light with luminance that can be observed by eyes.

The impedance between the first bonding electrode 43 and the adjacent one of the remaining bonding electrodes is increased, so that the value of the current transmitted from the second power supply voltage terminal of the first light-emitting group to the third power supply voltage signal line GND through the bonding electrode group 40 may be effectively reduced. As the impedance between the first bonding electrode 43 and the adjacent one of the remaining bonding electrodes increases, the value of the current transmitted from the second power supply voltage terminal to the third power supply voltage signal line GND through the bonding electrode group 40 decreases, and accordingly, the current passing through the corresponding light-emitting group 112 is sufficiently small until the light with luminance that can be observed by eyes cannot be generated, so that the problem that the light-emitting group 112 in the light-emitting region 111 has a weak luminance may be solved. As a result, the display image of the display apparatus does not suffer from blurring, ghosting and other situations that affect the image quality.

In some embodiments, as shown in FIG. 12, the impedance between the first bonding electrode 43 and the adjacent one of the remaining bonding electrodes is greater than 10G ohms.

For example, the first bonding electrode 43 is electrically connected to the second power supply voltage terminal of the light-emitting group 112, and the turn-on current of the mini LED and/or the micro LED is in the nanoampere level. Thus, in a case where the resistance from the feedback signal line FB to the third power supply voltage signal line GND is less than 10G ohms, it may be possible to cause the light-emitting group 112 connected to the feedback signal line FB to have a weak luminance. The impedance between the first bonding electrode 43 and the adjacent one of the remaining bonding electrodes is increased to more than 10G ohms, which may avoid a case that the light-emitting group 112 has a weak luminance, and thereby improve the picture quality of the display apparatus.

In some embodiments, as shown in FIG. 12, in an extending direction of the bonding electrode group 40, a ratio of a distance between the first bonding electrode 43 and the adjacent one of the remaining bonding electrodes to a distance between the two adjacent and consecutive ones of the remaining bonding electrodes is greater than or equal to 3.

In some examples, a way to increase the impedance between the first bonding electrode 43 and the adjacent one of the remaining bonding electrodes to 10G ohms or more is to increase the distance G between the first bonding electrode 43 and the adjacent one of the remaining bonding electrodes, so as to achieve the increase of the impedance between the first bonding electrode 43 and the adjacent one of the remaining bonding electrodes. In a case where the ratio of the distance G between the first bonding electrode 43 and the adjacent one of the remaining bonding electrodes to the distance L between the two adjacent and consecutive ones of the remaining bonding electrodes is greater than or equal to 3, the impedance between the first bonding electrode 43 and the adjacent one of the remaining bonding electrodes may be greater than or equal to 10G ohms.

For example, the distance L of the two adjacent and consecutive ones of the remaining bonding electrodes may be in a range of 100 μm to 200 μm; for example, the distance L of the two adjacent and consecutive ones of the remaining bonding electrodes is 100 μm, 150 μm or 200 μm. The distance G between the first bonding electrode 43 and the adjacent one of the remaining bonding electrodes includes a distance G1 between the first bonding electrodes 43 and the second bonding electrode 44 and a distance G2 between the first bonding electrodes 43 and the third bonding electrode 45. A ratio of a value of the distance G1 to the distance L of two adjacent and consecutive ones of the remaining bonding electrodes is greater than or equal to 3, and/or a ratio of a value of the distance G2 to the distance L of two adjacent and consecutive ones of the remaining bonding electrodes is greater than or equal to 3. For example, the distance G1 may be 300 μm, 450 μm or 600 μm, and the distance G2 may be 300 μm, 450 μm or 600 μm.

It will be further noted that "two adjacent and consecutive ones of the remaining bonding electrodes" in the embodiments of the disclosure means that two of the remaining bonding electrodes are close to each other, and no first empty space 41 and/or redundant bonding electrode 42 is provided between the two of the remaining bonding electrodes.

In some embodiments, the distance (the distance G) between the first bonding electrode 43 and the adjacent one of the remaining bonding electrodes is greater than 600 μm.

In some examples, the distance G1 is greater than 600 μm, for example, the distance G1 is 650 μm, 700 μm, or 800 μm; the distance G2 is greater than 600 μm, for example, the distance G2 is 650 μm, 700 μm, or 800 μm. In a case where the distance G1 is greater than 600 μm, the impedance between the first bonding electrode 43 and the second bonding electrode 44 is greater than 10G ohms. That is, the impedance between the light-emitting group 112 electrically connected to the feedback signal line FB and the third power supply voltage signal line GND is greater than 10G ohms. In a case where the impedance of the closed circuit formed by connecting the first power supply voltage terminal and the second power supply voltage terminal of the light-emitting group 112 is greater than 10G ohms, the current flowing through the first light-emitting group does not reach the turn-on current of the mini LED and/or the micro LED, which may not cause a case that the first light-emitting group has a weak luminance.

Figure 13:
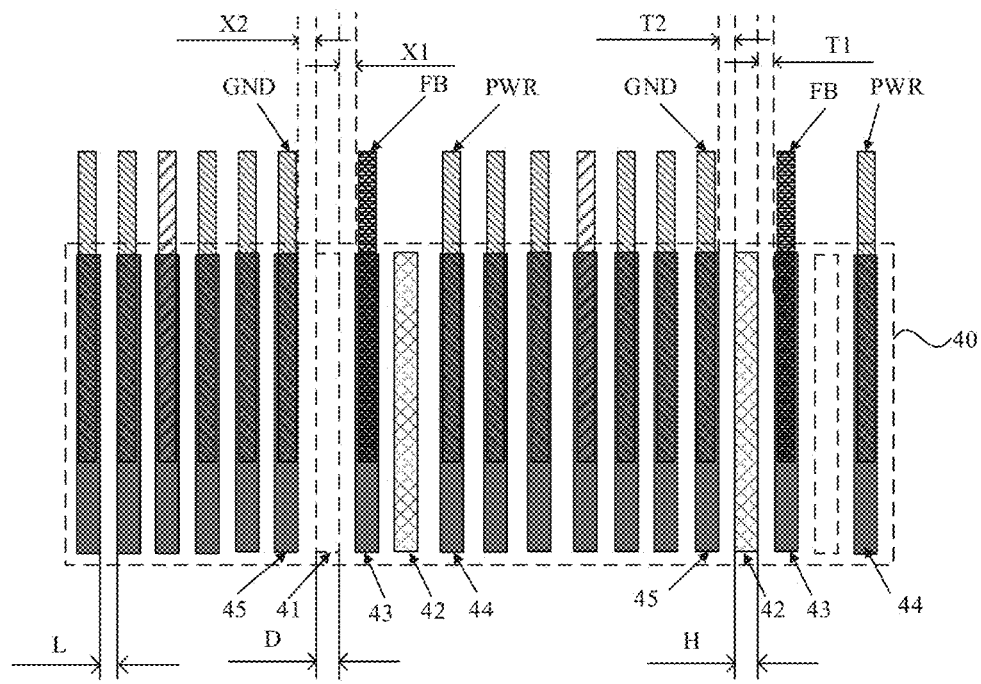
FIG. 13 is another connection structural diagram of a bonding electrode group and signal lines provided in some embodiments of the disclosure.

In some embodiments, as shown in FIGS. 12 and 13, at least one first empty space 41 and/or at least one redundant bonding electrode 42 is provided between the first bonding electrode 43 and the adjacent one of the remaining bonding electrodes. The first empty space 41 is a region, where a bonding electrode is to be provided and no bonding electrode is actually provided, reserved in the bonding electrode group 40; the redundant bonding electrode 42 transmits no signal.

In some examples, as shown in FIG. 13, a first empty space 41 is provided between the first bonding electrode 43 and the second bonding electrode 44 or between the first bonding electrode 43 and the third bonding electrode 45; the first empty space 41 refers to a position reserved in the bonding electrode group 40 where a bonding electrode is to be provided and no bonding electrode is actually provided; a dimension of the first empty space 41 in the extending direction of the bonding electrode group 40 may be greater than the distance L between two adjacent ones of the remaining bonding electrodes, and the dimension of the first empty space 41 in the extending direction of the bonding electrode group 40 is a width D of the first empty space 41.

For example, the distance L of two adjacent and consecutive ones of the remaining bonding electrodes may be 100 μm, 150 μm, or 200 μm, and the width D of the first empty space 41 is greater than the distance L of the two adjacent ones of the remaining bonding electrodes; for example, the width D of the first empty space 41 may be 150 μm, 200 μm or 300 μm. A distance X1 between the first empty space 41 and the first bonding electrode 43 is in a range of 100 μm to 200 μm; for example, the distance X1 between the first empty space 41 and the first bonding electrode 43 may be 100 μm, 150 μm or 200 μm. A distance X2 between the first empty space 41 and the second bonding electrode 44 is in a range of 100 μm to 200 μm; for example, the distance X2 between the first empty space 41 and the second bonding electrode 44 may be 100 μm, 150 μm or 200 μm.

In an example in which the distance L between two adjacent ones of the remaining bonding electrodes is 200 μm, the width D of the first empty space 41 is greater than 200 μm, i.e. the width D of the first empty space 41 is greater than 200 μm; for example, the width D of the first empty space 41 may be 300 μm. The distance X1 between the first empty space 41 and the first bonding electrode 43 is 200 μm, and the distance X2 between the first empty space 41 and the second bonding electrode 44 is 200 μm. That is, by setting the width D of the first empty space 41, the distance X1 of the first empty space 41 and the first bonding electrode 43, and the distance X2 of the first empty space 41 and the second bonding electrode 44, the distance (the distance G) between the first bonding electrode 43 and an adjacent one of the remaining bonding electrodes is larger than 600 μm. For example, the distance G1 of the first bonding electrode 43 and the second bonding electrode 44 or the distance G2 of the first bonding electrode 43 and the third bonding electrode 45 is 700 μm, and accordingly, the impedance of the first bonding electrode 43 and the second bonding electrode 44 or the impedance of the first bonding electrode 43 and the third bonding electrode 45 is larger than 10 G ohms.

In some other examples, as shown in FIG. 13, a redundant bonding electrode 42 is provided between the first bonding electrode 43 and the second bonding electrode 44 or between the first bonding electrode 43 and the third bonding electrode 45. The redundant bonding electrode 42 refers to an electrode, not electrically connected to any signal line, disposed at a position reserved in the bonding electrode group 40 where a bonding electrode is to be provided. That is, the redundant bonding electrode 42 transmits no electrical signal. A dimension of the redundant bonding electrode 42 in the extending direction of the bonding electrode group 40 may be greater than a distance L of two adjacent ones of the remaining bonding electrodes. The dimension of the redundant bonding electrode 42 in the extending direction of the bonding electrode group 40 is a width H of the redundant bonding electrode 42.

For example, the distance L of the two adjacent ones of the remaining bonding electrodes may be 100 μm, 150 μm or 200 μm, and the width H of the redundant bonding electrode 42 is greater than the distance L of the adjacent two of remaining bonding electrodes; for example, the width H of the redundant bonding electrode 42 may be 150 μm, 200 μm or 300 μm. A distance T1 between the redundant bonding electrode 42 and the first bonding electrode 43 is in a range of 100 μm to 200 μm. For example, the distance T1 between the redundant bonding electrode 42 and the first bonding electrode 43 may be 100 μm, 150 μm or 200 μm. A distance T2 between the redundant bonding electrode 42 and the second bonding electrode 44 is in a range of 100 μm to 200 μm. For example, the distance T2 between the redundant bonding electrode 42 and the second bonding electrode 44 may be 100 μm, 150 μm or 200 μm.

In an example in which the distance L between two adjacent and consecutive ones of the remaining bonding electrodes is 200 μm, the width H of the redundant bonding electrode 42 is greater than 200 μm, for example, the width H of the redundant bonding electrode 42 may be 300 μm; the distance T1 between the redundant bonding electrode 42 and the first bonding electrode 43 is 200 μm, and the distance T2 between the redundant bonding electrode 42 and the second bonding electrode 43 is 200 μm. That is, by setting the width H of the redundant bonding electrode 42, the distance T1 between the redundant bonding electrode 42 and the first bonding electrode 43, and the distance T2 between the redundant bonding electrode 42 and the second bonding electrode 43, the distance (the distance G) between the first bonding electrode 43 and the adjacent one of the remaining bonding electrode is larger than 600 μm. For example, the distance G1 between the first bonding electrode 43 and the second bonding electrode 44 or the distance G2 between the first bonding electrode and the third bonding electrode is 700 μm, and accordingly, the impedance of the first bonding electrode and the second bonding electrode or the impedance of the first bonding electrode and the third bonding electrode is larger than 10G ohms.

In some embodiments, a first bonding electrode and an adjacent one of the remaining bonding electrodes are provided therebetween with at least one redundant bonding electrode, or at least one first empty space, or both at least one redundant bonding electrode and at least one first empty space.

In some examples, one redundant bonding electrode, or a plurality of redundant bonding electrodes, or one first empty space, or a plurality of first empty spaces, or both one first empty space and one redundant bonding electrode may be disposed between the first bonding electrode and one of the remaining bonding electrodes adjacent to the first bonding electrode.

It may be understood that, one redundant bonding electrode and/or one first empty space is disposed between the first bonding electrode and the adjacent one of the remaining bonding electrodes, so that it is possible to achieve that the distance G1 between the first bonding electrode and the second bonding electrode and the distance G2 between the first bonding electrode and the third bonding electrode are each greater than 3 times the distance L between the two adjacent and consecutive ones of the remaining bonding electrodes. In a case where the larger the number of redundant bonding electrodes and/or first empty spaces provided between the first bonding electrode and the adjacent one of the remaining bonding electrodes, the larger the distance G1 between the first bonding electrode and the second bonding electrode and the distance G2 between the first bonding electrode and the third bonding electrode. Therefore, the number of redundant bonding electrodes and/or first empty spaces provided between the first bonding electrode and the adjacent one of the remaining bonding electrodes is not particularly limited.

In some embodiments, as shown in FIGS. 15a to 15f, the remaining bonding electrodes include a second bonding electrode 44, and the second bonding electrode 44 is adjacent to the first bonding electrode 43 and disposed on a side of the first bonding electrode 43. The second bonding electrode 44 is electrically connected to the first power supply pin Vdd of the chip, and the second bonding electrode 44 is configured to transmit a second level signal to the chip.

At least one redundant bonding electrode 42, or at least one first empty space 41, or both at least one redundant bonding electrode 42 and at least one first empty space 41 are disposed between the second bonding electrode 44 and the first bonding electrode 43.

Figure 14E:
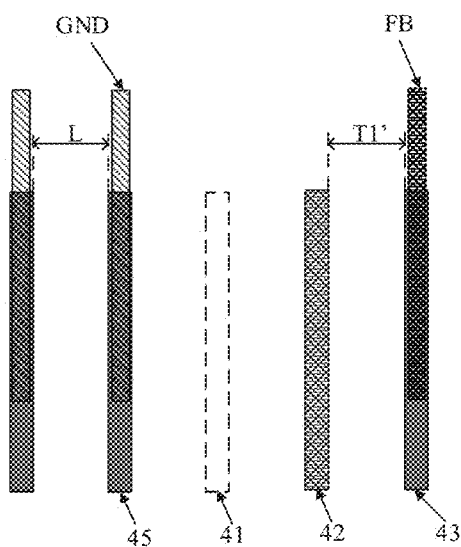
FIG. 14e is a first type of structural diagram of a first bonding electrode, remaining bonding electrodes, a first empty space, and a redundant bonding electrode provided in some embodiments of the present disclosure.
Figure 14F:
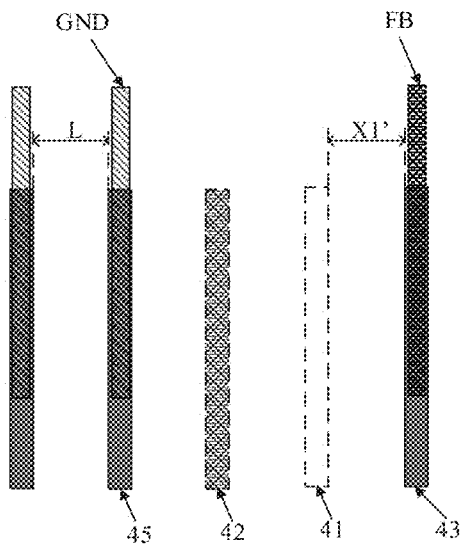
FIG. 14f is a second type of structural diagram of a first bonding electrode, remaining bonding electrodes, a first empty space, and a redundant bonding electrodes provided in accordance with some embodiments of the present disclosure.
Figure 15A:
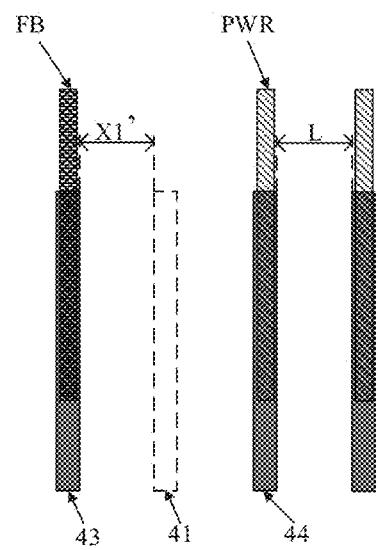
FIG. 15a is a third type of structural diagram of a first bonding electrode, remaining bonding electrodes, and a first empty space provided in some embodiments of the present disclosure.
Figure 15B:
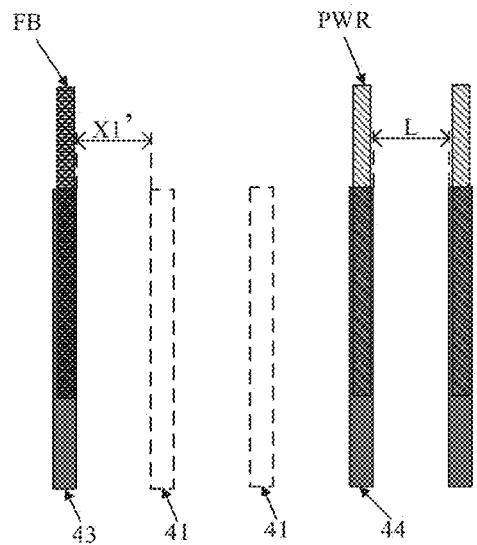
FIG. 15b is a fourth type of structural diagram of a first bonding electrode, remaining bonding electrodes, and first empty spaces provided in some embodiments of the present disclosure.
Figure 15C:
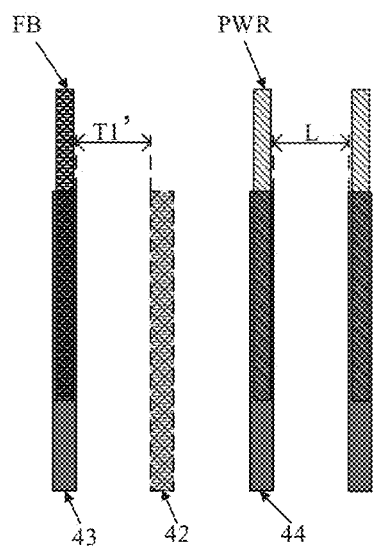
FIG. 15c is a third type of structural diagram of a first bonding electrode, remaining bonding electrodes, and a redundant bonding electrode provided in some embodiments of the present disclosure.
Figure 15D:
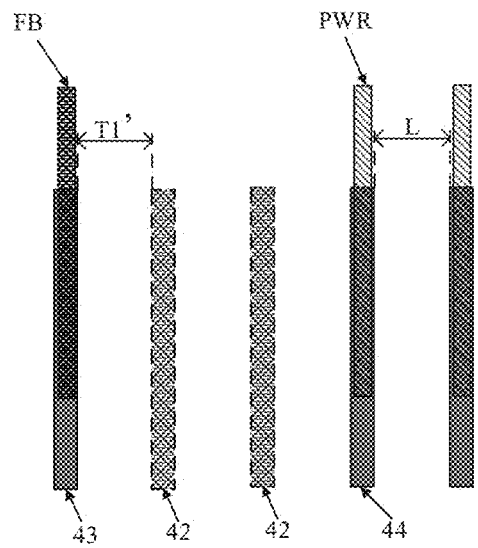
FIG. 15d is a fourth type of structural diagram of a first bonding electrode, remaining bonding electrodes, and redundant bonding electrodes provided in some embodiments of the present disclosure.
Figure 15E:
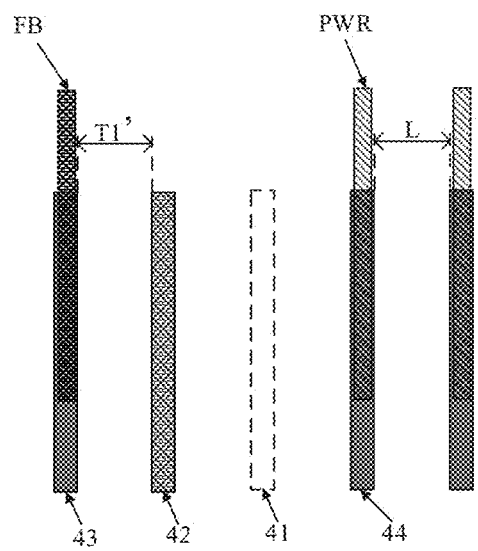
FIG. 15e is a third type of structural diagram of a first bonding electrode, remaining bonding electrodes, a first empty space, and a redundant bonding electrode provided in some embodiments of the present disclosure.
Figure 15F:
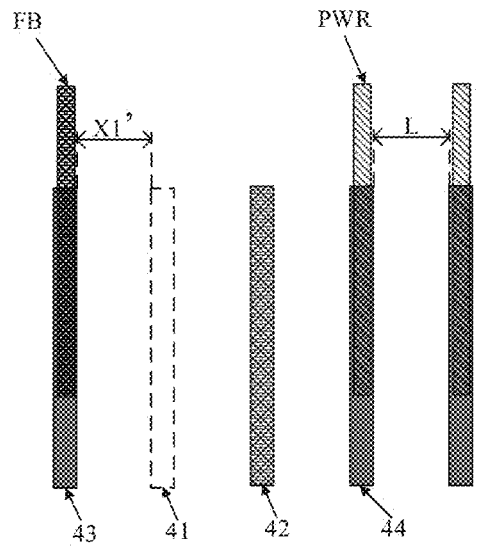
FIG. 15f is a fourth type of structural diagram of a first bonding electrode, remaining bonding electrodes, a first empty space, and a redundant bonding electrode provided in some embodiments of the present disclosure.

For example, as shown in FIG. 15a, one first empty space 41 may be disposed between the first bonding electrode 43 and the second bonding electrode 44. Alternatively, as shown in FIG. 15b, two first empty spaces 41 may be disposed between the first bonding electrode 43 and the second bonding electrode 44. Alternatively, as shown in FIG. 15c, one redundant bonding electrode 42 may be disposed between the first bonding electrode 43 and the second bonding electrode 44. Alternatively, as shown in FIG. 15d, two redundant bonding electrodes 42 may be disposed between the first bonding electrode 43 and the second bonding electrode 44. Alternatively, as shown in FIGS. 14e and 14f, one first empty space 41 and one redundant bonding electrode 42 may be disposed between the first bonding electrode 43 and the second bonding electrode 44.

In some embodiments, as shown in FIGS. 14a to 14f, the remaining bonding electrodes further include a third bonding electrode 45, and the third bonding electrode 45 is adjacent to the first bonding electrode 43 and disposed on the other side of the first bonding electrode 43. The third bonding electrode 45 is electrically connected to the second power supply pin Vss of the chip, and the third bonding electrode 45 is configured to transmit a first level signal to the chip. At least one redundant bonding electrode 42, or at least one first empty space 41, or both at least one redundant bonding electrode 42 and at least one first empty space 41 are disposed between the third bonding electrode 45 and the first bonding electrode 43.

Figure 14A:
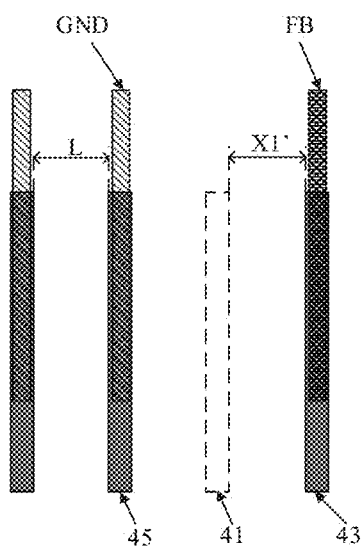
FIG. 14a is a first type of structural diagram of a first bonding electrode, remaining bonding electrodes, and a first empty space provided in some embodiments of the present disclosure.
Figure 14B:
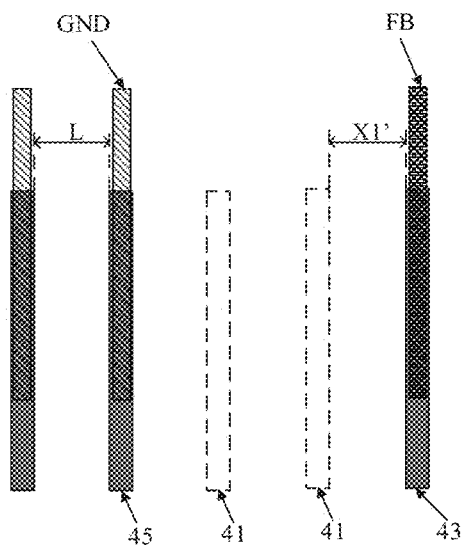
FIG. 14b is a second type of structural diagram of a first bonding electrode, remaining bonding electrodes, and first empty spaces provided in some embodiments of the present disclosure.
Figure 14C:
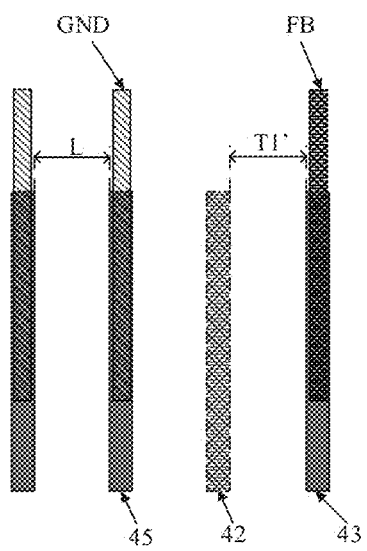
FIG. 14c is a first type of structural diagram of a first bonding electrode, remaining bonding electrodes, and a redundant bonding electrode provided in some embodiments of the present disclosure.
Figure 14D:
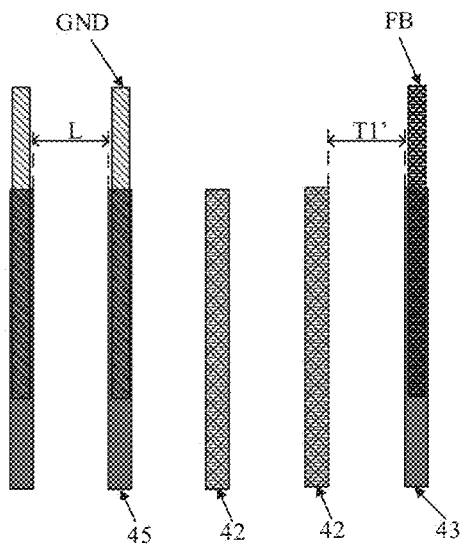
FIG. 14d is a second type of structural diagram of a first bonding electrode, remaining bonding electrodes, and redundant bonding electrodes provided in some embodiments of the present disclosure.

For example, as shown in FIG. 14*a*, one first empty space may be disposed between the first bonding electrode 43 and the third bonding electrode 45. Alternatively, as shown in FIG. 14*b*, two first empty spaces 41 may be disposed between the first bonding electrode 43 and the third bonding electrode 45. Alternatively, as shown in FIG. 14*c*, one redundant bonding electrode 42 may be disposed between the first bonding electrode 43 and the third bonding electrode 45. Alternatively, as shown in FIG. 14*d*, two redundant bonding electrodes 42 may be disposed between the first bonding electrode 43 and the third bonding electrode 45. Alternatively, as shown in FIGS. 14*e* and 14*f*, one first empty space 41 and one redundant bonding electrode 42 may be disposed between the first bonding electrode 43 and the third bonding electrode 45.

In some embodiments, as shown in FIGS. 14*a*, 14*b*, 15*a*, and 15*b*, a distance X1' of the first bonding electrode 43 and an immediately adjacent first empty space is equal to the distance L of two adjacent ones of the remaining bonding electrodes.

In some examples, at least one first empty space 41 is disposed between the first bonding electrode 43 and the second bonding electrode 44 or between the first bonding electrode 43 and the third bonding electrode 45. For example, there are two first empty spaces 41 in FIGS. 14*b* and 15*b*. The first empty space 41 immediately adjacent to the first bonding electrode 43 refers to one of the at least one first empty space 41 that is closest to the first bonding electrode 43 and spaced from the first bonding electrode 43 by the distance X1', the distance X1' being equal to the distance L between the two adjacent ones of the remaining bonding electrodes.

In some other embodiments, as shown in FIGS. 14*c*, 14*d*, 15*c* and 15*d*, a distance T1' of a first bonding electrode and an immediately adjacent redundant bonding electrode is equal to the distance L of two adjacent ones of the remaining bonding electrodes.

In some examples, at least one redundant bonding electrode 42 is disposed between the first bonding electrode 43 and the second bonding electrode 44 or between the first third bonding electrode 43 and the third bonding electrode 45. For example, there are two redundant bonding electrodes 42 in FIGS. 14*d* and 15*d*. The redundant bonding electrode 42 immediately adjacent to the first bonding electrode 43 refers to one of the at least one redundant bonding electrode 42 that is closest to the first bonding electrode 43 and spaced from the first bonding electrode 43 by the distance T1', the distance T1' being equal to the distance L between the two adjacent ones of the remaining bonding electrodes.

Figure 16:
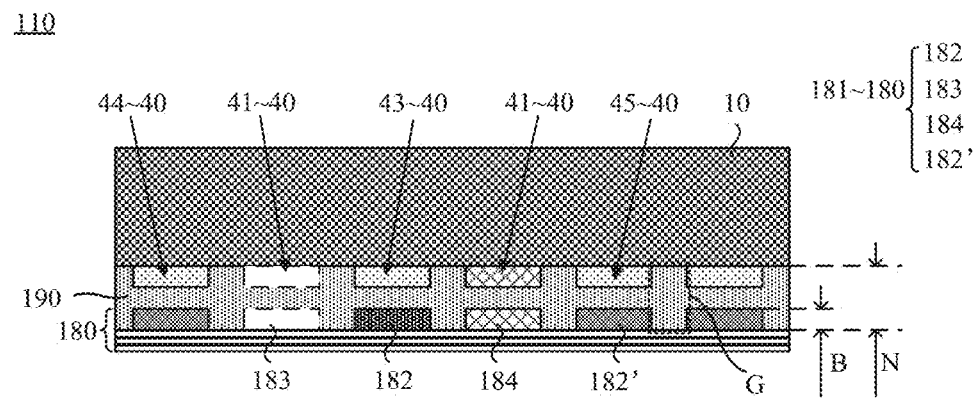
FIG. 16 is another connection structural diagram of a bonding electrode group and a gold finger provided in some embodiments of the disclosure.

In some embodiments, as shown in FIG. 16, the bonding electrode group is electrically connected to the gold finger 181 in the flexible printed circuit board; the gold finger 181 includes a plurality of conductive contacts, the plurality of conductive contacts includes at least a first conductive contact 182 and remaining conductive contacts 182', and each of the plurality of conductive contacts is electrically connected to a bonding electrode. The first conductive contact 182 is configured to be electrically connected to the first bonding electrode 43, and a second empty space 183 and/or a redundant contact 184 is provided between the first conductive contact and an adjacent one of the remaining conductive contacts. An orthographic projection of a second empty space 183 on the back plate 10 at least partially overlaps with an orthographic projection of a first empty space 41 on the back plate 10, and an orthographic projection of a redundant bonding electrode 42 on the back plate 10 at least partially overlaps with an orthographic projection of a redundant conductive contact 184 on the back plate 10.

In some examples, the gold finger 181 includes a plurality of conductive contacts, the number of the conductive contacts of the gold finger is equal to the number of the bonding electrodes of the bonding electrode group 40 electrically connected to the gold finger 181, and each conductive contact of the gold finger 181 is electrically connected to a bonding electrode. The plurality of conductive contacts include a first conductive contact 182, and the first conductive contact 182 is electrically connected to the first bonding electrode 43.

Second empty space(s) 183 and/or redundant contact(s) 184 are further provided in the gold finger 181. The second empty space 183 is a position reserved in the gold finger 181 where a conductive contact is to be provided and no conductive contact is actually provided. The redundant contact 184 refers to a conductive contact, not electrically connected to any signal line, disposed at a position reserved in the gold finger 181 where a conductive contact is to be provided. That is, this conductive contact does not transmit an electrical signal.

The positions and the number of each of the second empty spaces 183 and the redundant conductive contacts 184 arranged in the gold finger 181 are related to the bonding electrode group 40, after the bonding electrode group 40 is bonded to the gold finger 181, a conductive contact is electrically connected to a bonding electrode, a first empty space 41 is attached to a second empty space 183, and a redundant contact 184 is electrically connected to a redundant bonding electrode 42. An orthographic projection of each conductive contact on the back plate 10 overlaps with an orthographic projection of a bonding electrode on the back plate 10; the orthographic projection of the first conductive contact 182 on the back plate 10 overlaps with the an orthographic projection of first bonding electrode 43 on the back plate 10, the orthographic projection of the second empty space 183 on the back plate 10 overlaps with an orthographic projection of the first empty space 41 on the back plate 10, and the orthographic projection of the redundant contact 184 on the back plate 10 overlaps with an orthographic projection of the redundant bonding electrode 42 on the back plate 10.

In some embodiments, as shown in FIG. 16, an anisotropic conductive film 190 is provided between the bonding electrode group 40 and the gold finger 181, and it is understood that, the thicker the anisotropic conductive film 190 between the bonding electrode group 40 and the gold finger 181, the more conductive particles are contained in the anisotropic conductive film 190. Thus, in a case where the distance between the first bonding electrode and an adjacent one of the remaining bonding electrodes is constant, the thick anisotropic conductive film 190 may reduce the impedance between the first bonding electrode and the adjacent one of the remaining bonding electrodes, so as to increase the value of the current transmitted from the second power voltage terminal of the light-emitting group 112 to the third power supply voltage signal line GND through the bonding electrode group 40, and increase the probability that a light-emitting group 112 in the light-emitting region 111 has a weak luminance.

In some examples, another way to increase the impedance between the first bonding electrode 43 and the adjacent one of the remaining bonding electrodes to 10G ohms or more is to reduce the thickness of the anisotropic conductive film 190 provided between the bonding electrode group 40 and the gold finger 181, so as to reduce the amount of the anisotropic conductive film 190 between the first bonding electrode 43 and the adjacent one of the remaining bonding electrodes.

After the gold finger 181 and the bonding electrode group 40 are pressed together, a part of the anisotropic conductive film 190 is filled into a gap between two adjacent bonding electrodes and a gap between two adjacent conductive contacts, and the anisotropic conductive film 190 located between the conductive contacts electrically connects the corresponding two conductive contacts, and the anisotropic conductive film 190 located between the bonding electrodes electrically connects the corresponding two bonding electrodes. As shown in FIG. 16, the maximum thickness N of the anisotropic conductive film 190 is the distance between an end of the gold finger 181 and an end of the bonding electrode group 40, the two ends being far away from each other. Since a part of the anisotropic conductive film 190 fills into the gap between two adjacent bonding electrodes and the gap between two adjacent conductive contacts, the maximum thickness N of the anisotropic conductive film 190 is related to the thickness of the gold finger 181 and the thickness of the bonding electrode group.

In some embodiments, as shown in FIG. 16, the thickness B of the gold finger is in a range of 6 μm to 10 μm.

In some examples, the thickness B of the gold finger 181 is 6 μm, 8 μm, or 10 μm. The thickness B of the gold finger 181 is a dimension of the gold finger 181 in a direction perpendicular to a plane of the bonding electrode group 40.

In an example in which the thickness of the gold finger 181 is 8 μm, the gold finger 181 is electrically connected to the bonding electrode group 40 after pressing together, the anisotropic conductive film 190 is filled between the bonding electrode group 40 and the gold finger 181, and the impedance between two adjacent bonding electrodes of the bonding electrode group is greater than 10G ohms.

In some embodiments, as shown in FIG. 16, the anisotropic conductive film 190 is disposed between the bonding electrode group 40 and the gold finger 181, and the thickness N of the anisotropic conductive film 190 is in a range of 9 μm to 13 μm. The thickness N here refers to the maximum thickness N of the anisotropic conductive film 190 in the region G shown in FIG. 16.

For example, the anisotropic conductive film 190 is filled between the bonding electrode group 40 and the gold finger 181, so that the conductive contacts are electrically connected with the respective bonding electrodes by pressing. The thickness B of the gold finger is in a range of 6 μm to 10 μm, and after pressing, the thickness N of the anisotropic conductive film between the bonding electrode group 40 and the gold finger 181 is in a range of 9 μm to 13 μm. For example, the thickness B of the gold finger 181 is 6 μm, and the thickness N of the anisotropic conductive film 190 is 9 μm; the thickness B of the gold finger 181 is 8 μm, and the thickness N of the anisotropic conductive film 190 is 11 μm; alternatively, the thickness B of the gold finger 181 is 10 μm, and the thickness N of the anisotropic conductive film 190 is 13 μm.

The thickness N of the anisotropic conductive film 190 is the maximum distance between the bonding electrode group 40 and the gold finger 181, that is, a distance between a position between two adjacent bonding electrodes and a position between two corresponding adjacent conductive contacts. In a case where the thickness N of the anisotropic conductive film 190 is reduced, the amount of the anisotropic conductive film 190 between the bonding electrode group 40 and the gold finger 181 is reduced, and the amount of the anisotropic conductive film 190 between two adjacent bonding electrodes is reduced. Thus, the content of the conductive particles contained in the anisotropic conductive film 190 between two adjacent bonding electrodes is reduced, so that the impedance between two adjacent bonding electrodes is increased. In a case where the thickness B of the gold finger 181 is 8 μm, and the thickness N of the anisotropic conductive film 190 is 11 μm, the impedance between the first bonding electrode 43 and an adjacent one of the remaining bonding electrodes is greater than 10G ohms, which satisfies the leakage requirement, so that the light-emitting group electrically connected to the feedback signal line does not generate a light with weak luminance.

Figure 17:
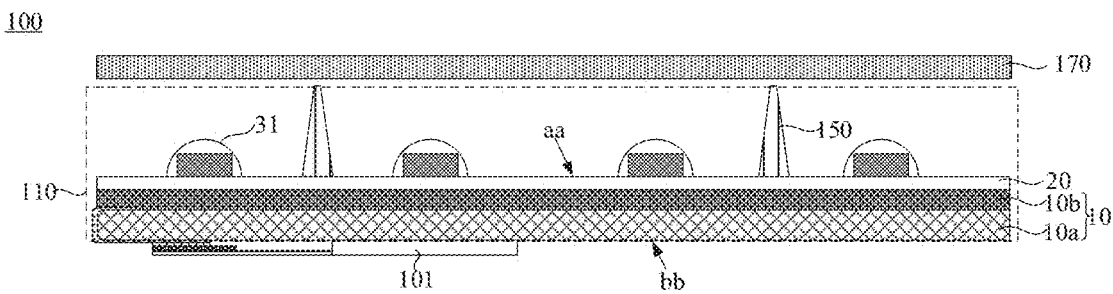
FIG. 17 is a structural diagram of yet another backlight module provided in some embodiments of the present disclosure.

On another hand, some embodiments of the present disclosure provide a backlight module 100, as shown in FIG. 17, the backlight module 100 includes the light-emitting substrate 110 provided in any one of the embodiments of the above aspect and a driver chip 101. The driver chip 101 is disposed on a backlight side bb of the light-emitting substrate 110, the driver chip 101 is electrically connected to the first conductive contact, and the driver chip 101 is configured to receive a feedback signal output by the chip.

In some examples, the backlight module 100 includes the light-emitting substrate 110 provided in the above embodiments. That is, when the light exit side aa of the backlight module 100 is in an off state, it will not cause a problem that the light exit side aa of the backlight module 100 cannot be in the off state completely caused by a case that part of the light-emitting devices of the light-emitting substrate 110 has a weak luminance. As a result, it may be possible to avoid a problem such as ghosting of the display image.

In some embodiments, in addition to the light-emitting substrate 110, the backlight module 100 further includes a plurality of supporters 150, a diffuser plate, a quantum dot film, a diffuser sheet, and a composite film. The plurality of supporters 150 are fixed on the light exit side aa of the light-emitting substrate 110. The diffuser plate is disposed on an end of the plurality of supporters 150 away from the light-emitting substrate 110. The quantum dot film is disposed on a side of the diffusion plate away from the light-emitting substrate 110. The diffusion sheet is disposed on a side of the quantum dot film away from the light-emitting substrate 110. The composite film is disposed on a side of the diffusion sheet away from the light-emitting substrate 110.

For example, the plurality of supporters 150 are uniformly arranged on the light-emitting substrate 110, and support each optical film 170, so that there is a distance between the reflective film 20 of the light-emitting substrate 110 and the optical film 170. The distance is an optical distance (OD). That is, light emitted from two adjacent light-emitting devices 31 may be mixed between the reflective film 20 and the optical film 170 (e.g., a diffusion sheet). The optical film 170 may include the diffusion plate, the quantum dot film, the diffusion sheet and the composite film, and a function of each optical film are described in the above embodiments, and is not described here.

Figure 18:
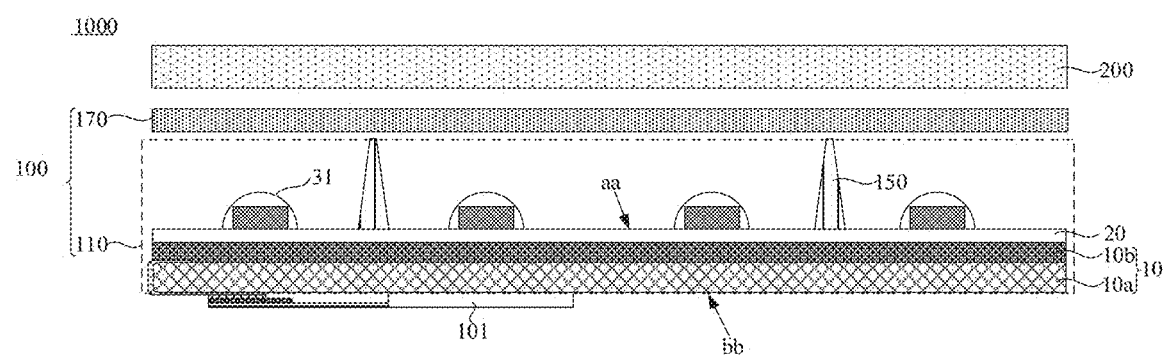
FIG. 18 is a structural diagram of another display apparatus provided in some embodiments of the present disclosure.

In yet another aspect, some embodiments of the present disclosure provide a display apparatus 1000, as shown in FIG. 18, the display apparatus 1000 includes the backlight module 100 provided in any one of the embodiments of the another aspect and a display panel 200. The display panel 200 is stacked on the light exit side of the backlight module 100.

For example, the display apparatus 1000 includes the backlight module 100 provided in the above embodiments, and has the same effects and functions as the backlight module 100. The display apparatus 1000 may be a mobile phone, a wireless apparatus, a personal data assistant (PDA), a hand-held or portable computer, a GPS receiver/navigator, a camera, an MP4 video player, a video camera, a game console, a watch, a clock, a calculator, a television monitor, a flat panel display, a computer monitor, an automobile display (e.g., an odometer display), a navigator, a cockpit controller and/or display, a display of camera views (e.g., a display of a rear-view camera in a vehicle), an electronic photo, an electronic billboard or sign, a projector, a packaging and aesthetic structure (e.g., a display for displaying an image of a piece of jewelry), etc. The display apparatus 1000 does not have the problem such as ghosting of a display image caused by a case that part of the light-emitting devices has a weak luminance in the off state.

The foregoing descriptions are merely specific implementation manners of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting substrate comprising:
   a back plate;
   a feedback signal line;
   a plurality of light-emitting regions arranged in an array and disposed on the back plate, wherein each light-emitting region is provided with at least one light-emitting group therein, a light-emitting group of the at least one light-emitting group is a first light-emitting group, and a second power supply voltage terminal of the first light-emitting group is electrically connected to the feedback signal line; and
   a bonding electrode group disposed on the back plate, wherein the bonding electrode group includes a plurality of bonding electrodes disposed in parallel, and the plurality of bonding electrodes includes a first bonding electrode and remaining bonding electrodes;
   wherein the feedback signal line is electrically connected to the first bonding electrode, the feedback signal line is configured to transmit a feedback signal;
   an impedance between the first bonding electrode and an adjacent one of the remaining bonding electrodes is larger than an impedance between two adjacent and consecutive ones of the remaining bonding electrodes; and
   in an extending direction of the bonding electrode group, a ratio of a distance between the first bonding electrode and the adjacent one of the remaining bonding electrodes to a distance between the two adjacent and consecutive ones of the remaining bonding electrodes is greater than or equal to 3.

2. The light-emitting substrate according to claim 1, wherein the impedance between the first bonding electrode and the adjacent one of the remaining bonding electrodes is greater than 10G ohms.

3. The light-emitting substrate according to claim 1, wherein the distance between the first bonding electrode and the adjacent one of the remaining bonding electrodes is greater than 600 μm.

4. The light-emitting substrate according to claim 1, wherein at least one first empty space and/or at least one redundant bonding electrode is provided between the first bonding electrode and the adjacent one of the remaining bonding electrodes;
   wherein a first empty space is a region, where a bonding electrode is to be provided and no bonding electrode is actually provided, reserved in the bonding electrode group; the redundant bonding electrode transmits no signal.

5. A light-emitting substrate comprising:
   a back plate;
   a feedback signal line;
   a plurality of light-emitting regions arranged in an array and disposed on the back plate, wherein each light-emitting region is provided with at least one light-emitting group therein, a light-emitting group of the at least one light-emitting group is a first light-emitting group, and a second power supply voltage terminal of the first light-emitting group is electrically connected to the feedback signal line; and
   a bonding electrode group disposed on the back plate, wherein the bonding electrode group includes a plurality of bonding electrodes disposed in parallel, and the plurality of bonding electrodes includes a first bonding electrode and remaining bonding electrodes; and
   a first power supply voltage signal line, wherein
   the feedback signal line is electrically connected to the first bonding electrode, the feedback signal line is configured to transmit a feedback signal;
   an impedance between the first bonding electrode and an adjacent one of the remaining bonding electrodes is larger than an impedance between two adjacent and consecutive ones of the remaining bonding electrodes;
   a first power supply voltage terminal of the first light-emitting group is electrically connected to the first power supply voltage signal line, and the remaining bonding electrodes include a power supply voltage bonding electrode electrically connected to the first power supply voltage signal line; and
   at least one first empty space and/or at least one redundant bonding electrode is provided between the power supply voltage bonding electrode and an adjacent one of the remaining bonding electrode.

6. The light-emitting substrate according to claim 1, further comprising a second power supply voltage signal line and a third power supply voltage signal line, wherein the light-emitting region is further provided at least one chip therein, and each light-emitting group is electrically connected to a single chip; an output pin of a chip is electrically connected to the second power supply voltage terminal of the first light-emitting group, a first power supply pin of the chip is electrically connected to the second power supply voltage signal line, and a second power supply pin of the chip is electrically connected to the third power supply voltage signal line;
   a plurality of chips located in a same light-emitting region are sequentially cascaded; and an output pin of a last chip in the plurality of cascaded chips is electrically connected to the feedback signal line.

7. The light-emitting substrate according to claim 1, wherein the light-emitting substrate further comprises a flexible circuit board or a chip on flex, wherein the flexible circuit board or the chip on flex includes a gold finger, and the bonding electrode group is electrically connected to the gold finger;
wherein a thickness of the gold finger is in a range of 6 μm to 10 μm.

8. The light-emitting substrate according to claim 7, wherein the gold finger includes a plurality of conductive contacts, the plurality of conductive contacts include at least a first conductive contact and remaining conductive contacts, and each of the plurality of conductive contacts is electrically connected to a bonding electrode; wherein the first conductive contact is configured to be electrically connected to the first bonding electrode, and a second empty space and/or a redundant contact is provided between the first conductive contact and an adjacent one of the remaining conductive contacts; and
at least one first empty space and/or at least one redundant bonding electrode is provided between the first bonding electrode and the adjacent one of the remaining bonding electrodes; wherein
an orthographic projection of the second empty space on the back plate at least partially overlaps with an orthographic projection of a first empty space on the back plate, and an orthographic projection of a redundant bonding electrode on the back plate at least partially overlaps with an orthographic projection of the redundant contact on the back plate.

9. The light-emitting substrate according to claim 7, wherein an anisotropic conductive film is provided between the bonding electrode group and the gold finger; and
a thickness of the anisotropic conductive film is in a range of 9 μm to 13 μm.

10. A backlight module, comprising:
the light-emitting substrate according to claim 1, wherein the light-emitting substrate further includes a flexible circuit board or a chip on flex, the flexible circuit board or the chip on flex includes a gold finger including a first conductive contact, and the bonding electrode group is electrically connected to the gold finger; the light-emitting region is further provided at least one chip therein; and
a driver chip disposed on a backlight side of the light-emitting substrate, wherein the driver chip is electrically connected to the first conductive contact, and the driver chip is configured to receive a feedback signal output by a chip.

11. The backlight module according to claim 10, wherein the backlight module further comprises:
a plurality of supporters fixed on a light exit side of the light-emitting substrate;
a diffuser plate disposed on an end of the plurality of supporters away from the light-emitting substrate;
a quantum dot film disposed on a side of the diffusion plate away from the light-emitting substrate;
a diffusion sheet disposed on a side of the quantum dot film away from the light-emitting substrate; and
a composite film disposed on a side of the diffusion sheet away from the light-emitting substrate.

12. A display apparatus, comprising:
the backlight module according to claim 10; and
a display panel stacked on a light exit side of the backlight module.

13. The light-emitting substrate according to claim 4, wherein in a case where at least one first empty space is provided between the first bonding electrode and the adjacent one of the remaining bonding electrodes, a width of a first empty space is greater than the distance between the two adjacent and consecutive ones of the remaining bonding electrodes.

14. The light-emitting substrate according to claim 4, wherein in a case where at least one redundant bonding electrode is provided between the first bonding electrode and the adjacent one of the remaining bonding electrodes, a width of a redundant bonding electrode is greater than the distance between the two adjacent and consecutive ones of the remaining bonding electrodes.

15. The light-emitting substrate according to claim 4, wherein in a case where at least one first empty space is provided between the first bonding electrode and the adjacent one of the remaining bonding electrodes, a distance between the first bonding electrode and an immediately adjacent first empty space is equal to the distance of the two adjacent and consecutive ones of the remaining bonding electrodes.

16. The light-emitting substrate according to claim 4, wherein in a case where at least one redundant bonding electrode is provided between the first bonding electrode and the adjacent one of the remaining bonding electrodes, a distance between the first bonding electrode and an immediately adjacent redundant bonding electrode is equal to the distance of the two adjacent and consecutive ones of the remaining bonding electrodes.

17. A light-emitting substrate comprising:
a back plate;
a feedback signal line;
a plurality of light-emitting regions arranged in an array and disposed on the back plate, wherein each light-emitting region is provided with at least one light-emitting group therein, a light-emitting group of the at least one light-emitting group is a first light-emitting group, and a second power supply voltage terminal of the first light-emitting group is electrically connected to the feedback signal line;
a bonding electrode group disposed on the back plate, wherein the bonding electrode group includes a plurality of bonding electrodes disposed in parallel, and the plurality of bonding electrodes includes a first bonding electrode and remaining bonding electrodes; and
a second power supply voltage signal line and a third power supply voltage signal line;
wherein the feedback signal line is electrically connected to the first bonding electrode, the feedback signal line is configured to transmit a feedback signal;
an impedance between the first bonding electrode and an adjacent one of the remaining bonding electrodes is larger than an impedance between two adjacent and consecutive ones of the remaining bonding electrodes;
the light-emitting region is further provided at least one chip therein, and each light-emitting group is electrically connected to a single chip; an output pin of a chip is electrically connected to the second power supply voltage terminal of the first light-emitting group, a first power supply pin of the chip is electrically connected to the second power supply voltage signal line, and a second power supply pin of the chip is electrically connected to the third power supply voltage signal line; and
a plurality of chips located in a same light-emitting region are sequentially cascaded; and an output pin of a last chip in the plurality of cascaded chips is electrically connected to the feedback signal line.

18. The light-emitting substrate according to claim 17, wherein the remaining bonding electrodes include a second bonding electrode disposed on a side adjacent to the first bonding electrode, the second power supply voltage signal line is electrically connected to the second bonding electrode, and the second bonding electrode is configured to transmit a second level signal to the chip;

at least one redundant bonding electrode, or at least one first empty space, or both at least one redundant bonding electrode and at least one first empty space are provided between the second bonding electrode and the first bonding electrode.

19. The light-emitting substrate according to claim 17, wherein the remaining bonding electrodes include a third bonding electrode disposed on another side adjacent to the first bonding electrode, the third power voltage signal line is electrically connected to the third bonding electrode, and the third bonding electrode is configured to transmit a first level signal to the chip;

at least one redundant bonding electrode, or at least one empty space, or both at least one redundant bonding electrode and at least one first empty space are provided between the third bonding electrode and the first bonding electrode.

20. The light-emitting substrate according to claim 18, wherein the remaining bonding electrodes further include a third bonding electrode disposed on another side adjacent to the first bonding electrode, the third power voltage signal line is electrically connected to the third bonding electrode, and the third bonding electrode is configured to transmit a first level signal to the chip;

another at least one redundant bonding electrode, or another at least one empty space, or both another at least one redundant bonding electrode and another at least one first empty space are provided between the third bonding electrode and the first bonding electrode.

* * * * *